(12) United States Patent
Kurley et al.

(10) Patent No.: US 10,541,134 B2
(45) Date of Patent: Jan. 21, 2020

(54) HALOMETALLATE LIGAND-CAPPED SEMICONDUCTOR NANOCRYSTALS

(71) Applicant: The University of Chicago, Chicago, IL (US)

(72) Inventors: James Kurley, Chicago, IL (US); Hao Zhang, Urbana, IL (US); Dmitri V. Talapin, Riverside, IL (US); Jake Russell, Arlington, TN (US); Margaret Hervey Hudson, Chicago, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 15/772,258

(22) PCT Filed: Nov. 2, 2016

(86) PCT No.: PCT/US2016/060026
§ 371 (c)(1),
(2) Date: Apr. 30, 2018

(87) PCT Pub. No.: WO2017/079225
PCT Pub. Date: May 11, 2017

(65) Prior Publication Data
US 2018/0315600 A1    Nov. 1, 2018

Related U.S. Application Data

(60) Provisional application No. 62/249,540, filed on Nov. 2, 2015.

(51) Int. Cl.
*H01L 21/02*    (2006.01)
*G01T 1/202*    (2006.01)

(52) U.S. Cl.
CPC ...... *H01L 21/02628* (2013.01); *G01T 1/2023* (2013.01); *H01L 21/0256* (2013.01);
(Continued)

(58) Field of Classification Search
CPC ......... H01L 21/02628; H01L 21/02554; H01L 21/02562; H01L 21/0256; H01L 21/02601; G01T 1/2023
(Continued)

(56) References Cited

U.S. PATENT DOCUMENTS 9,346,998 B2    5/2016    Talapin et al.
9,570,549 B2 *  2/2017    Jang ...................... B82Y 30/00
(Continued)

OTHER PUBLICATIONS

Zhang et al., Solution-Processed, Ultrathin Solar Cells from CdCl3-Capped CdTe Nanocrystals: The Multiple Roles of CdCl3-Ligands, J. Am. Chem. Soc., Jun. 7, 2016, 138 (24), pp. 7464-7467; DOI: 10.1021/jacs.6b03240.
(Continued)

*Primary Examiner* — David P Porta
*Assistant Examiner* — Gisselle M Gutierrez
(74) *Attorney, Agent, or Firm* — Bell & Manning, LLC

(57) ABSTRACT

Halometallate-capped semiconductor nanocrystals and methods for making the halometallate-capped semiconductor nanocrystals are provided. Also provided are methods of using solutions of the halometallate-capped semiconductor nanocrystals as precursors for semiconductor film formation. When solutions of the halometallate ligand-capped semiconductor nanocrystals are annealed, the halometallate ligands can act as grain growth promoters during the sintering of the semiconductor nanocrystals.

28 Claims, 9 Drawing Sheets

(52) U.S. Cl.
CPC .. *H01L 21/02554* (2013.01); *H01L 21/02562* (2013.01); *H01L 21/02601* (2013.01)

(58) Field of Classification Search
USPC .................................................. 250/370.11
See application file for complete search history.

(56) References Cited

U.S. PATENT DOCUMENTS

| | | | |
|---|---|---|---|
| 2006/0062902 A1 | 3/2006 | Sager et al. | |
| 2008/0142075 A1 | 6/2008 | Reddy et al. | |
| 2013/0280854 A1* | 10/2013 | Jasieniak | B82Y 30/00 438/93 |
| 2014/0346442 A1 | 11/2014 | Nag et al. | |
| 2016/0133839 A1* | 5/2016 | Li | H01L 51/009 257/40 |
| 2018/0144934 A1 | 5/2018 | Dolzhnikov et al. | |

OTHER PUBLICATIONS

Dirin et al., Lead Halide Perovskites and Other Metal Halide Complexes As Inorganic Capping Ligands for Colloidal Nanocrystals, J. Am. Chem. Soc., Apr. 18, 2014, 136 (18), pp. 6550-6553; DOI: 10.1021/ja5006288.

Nag et al., Metal-free Inorganic Ligands for Colloidal Nanocrystals . . . Surface Ligands, J. Am. Soc. Chem., Jun. 17, 2011, 133, pp. 10612-10620.

Norman et al., Electrical Transport and Grain Growth in Solution-Cast, Chloride-Terminated Cadmium Selenide Nanocrystal Thin Films, *ACS Nano*, 8, Jun. 24, 2014, pp. 7513-7521.

Ning et al., Solar Cells Based on Inks of n-Type Colloidal Quantum Dots, ACS Nano, 2014, vol. 8, No. 10, pp. 10321-10327.

Fafarman et al., Thiocyanate-Capped Nanocrystal Colloids: Vibrational Reporter of Surface Chemistry and Solution-Based Route to Enhanced Coupling in Nanocrystal Solids, *J. Am. Soc. Chem.*, Aug. 17, 2011, 133, pp. 15753-15761.

Ning et al., Quantum-dot-in-perovskite solids, Nature, vol. 523, Jul. 16, 2015.

Llordes et al., Tunable near-infrared and visible-light transmittance in nanocrystal-in-glass composites, *Nature*, vol. 500, Aug. 15, 2013.

Huang et al., Surface Functionalization of Semiconductor and Oxide Nanocrystals with Small Inorganic Oxoanions . . . Polyoxometalate Ligands, *ACS Nano*, vol. 8, No. 9, Aug. 24, 2014, pp. 9388-9402.

Son et al., All-Inorganic Nanocrystals as a Glue for BiSbTe Grains: Design of Interfaces in Mesostructured Thermoelectric Materials, *Angew. Chem. Int. Ed.*, 53, May 22, 2014, pp. 7466-7470.

Dolzhnikov et al., Composition-matched molecular "solders" for semiconductors, Science, vol. 347, Jan. 23, 2015, pp. 425-428.

Foos et al., Inorganic Photovoltaic Devices Fabricated Using Nanocrystal Spray Deposition, ACS Appl. Mater. Interfaces, 5, Sep. 5, 2013, pp. 8828-8832.

Townsend et al., Impact of Nanocrystal Spray Deposition on Inorganic Solar Cells, J. G. *ACS Appl. Mater. Interfaces*, 6, Apr. 22, 2014, pp. 7902-7909.

Zhang et al., Colloidal Nanocrystals with Inorganic Halide, Pseudohalide, and Halometallate Ligands, ACS Nano, vol. 8, No. 7, Jul. 2, 2014, pp. 7359-7369.

Jang et al., Solution-Processed Transistors Using Colloidal Nanocrystals with Composition-Matched Molecular "Solders": Approaching Single Crystal Mobility, Nano Lett., 15, Aug. 17, 2015, pp. 6309-6317.

I. M. Dharmadasa, Review of the CdCl2 Treatment Used in CdS/CdTe Thin Film Solar Cell Development and New Evidence towards Improved Understanding, Coatings, 4, Apr. 30, 2014, pp. 282-307.

International Search Report and Written Opinion mailed in PCT/US2016/060026, dated Jan. 19, 2017.

\* cited by examiner

HALOMETALLATE LIGAND-CAPPED SEMICONDUCTOR NANOCRYSTALS

CROSS-REFERENCE TO RELATED APPLICATIONS

The present application is a National Stage Entry of International Application No. PCT/US2016/060026 that was filed Nov. 2, 2016, the entire contents of which are hereby incorporated by reference, which claims priority to U.S. Provisional Patent Application No. 62/249,540 that was filed Nov. 2, 2015, the entire contents of which are hereby incorporated by reference.

REFERENCE TO GOVERNMENT RIGHTS

This invention was made with government support under DE-EE0005312 awarded by Department of Energy. The government has certain rights in the invention.

BACKGROUND

Over the past forty years, efforts to improve photovoltaics have taken crystalline silicon nearly to its theoretical limit. Second-generation solar cells using direct gap semiconductors, such as CdTe, have developed to the stage of rivaling silicon. Solution-processing offers an efficient and economically viable route to thin film CdTe-based solar cells. In particular, sintered CdTe thin films deposited from soluble CdTe nanocrystals (NCs) have proven effective as the absorber layer for CdTe solar cells.

Solution-processed solar cells made using roll-to-roll friendly techniques have garnered increasing interest as a low-cost alternative to single crystal silicon or chemical vapor deposited gallium arsenide thin films. A wide variety of materials have been solution processed into photovoltaics, including CdTe. Many of the top solar cell power conversion efficiencies (PCE) have been achieved using spin-coating to produce a uniform semiconductor layer. However, spin-coating has many disadvantages: significant waste of material, mediocre scalability, low throughput, and limited substrate geometries. All of these factors limit the cost reduction, speed of implementation, and flexibility desired from the transformation of new materials strategies into effective technologies.

SUMMARY

Halometallate-capped semiconductor nanocrystals and methods for making the halometallate-capped semiconductor nanocrystals are provided. Also provided are methods of using solutions of the halometallate-capped semiconductor nanocrystals as precursors for the formation of semiconductor films and devices incorporating the films as active layers.

One embodiment of a method of forming a semiconductor film comprises: (a) forming a solution of halometallate-capped semiconductor nanocrystals, the halometallate-capped semiconductor nanocrystals comprising: (i) semiconductor nanocrystals, each semiconducting nanocrystal having a surface; and (ii) halometallate ligands bound to the surfaces of the semiconductor nanocrystals; (b) coating the solution comprising the halometallate-capped semiconductor nanocrystals on a substrate surface; and (c) annealing the coating, wherein the nanocrystals are sintered to form the semiconductor film.

One embodiment of a method of forming an optoelectronic device comprises: (a) forming a solution of halometallate-capped semiconductor nanocrystals, the halometallate-capped semiconductor nanocrystals comprising: (i) semiconductor nanocrystals, each semiconducting nanocrystal having a surface; and (ii) halometallate ligands bound to the surfaces of the semiconductor nanocrystals; (b) coating the solution comprising the halometallate-capped semiconductor nanocrystals on a surface of a first electrode; (c) annealing the coating, wherein the semiconductor nanocrystals are sintered to form a photoactive, light-absorbing semiconductor film; (d) forming a layer of charge transporting material over the photoactive, light-absorbing semiconductor film; and (e) forming a second electrode on the layer of charge transporting material.

One embodiment of a method of forming a field effect transistor comprises: (a) forming a solution of halometallate-capped semiconductor nanocrystals, the halometallate-capped semiconductor nanocrystals comprising: (i) semiconductor nanocrystals, each semiconducting nanocrystal having a surface; and (ii) halometallate ligands bound to the surfaces of the semiconductor nanocrystals; (b) coating the solution comprising the halometallate-capped semiconductor nanocrystals on a surface of a gate dielectric layer; (c) annealing the coating, wherein the semiconductor nanocrystals are sintered to form a semiconductor film that provides a conducting channel layer for the field effect transistor; (d) forming a source electrode on the semiconductor film; (e) forming a drain electrode on the semiconductor film; and (f) forming a gate electrode on the gate dielectric layer.

Some embodiments of the halometallate-capped Group II-VI nanocrystals comprise: Group II-VI nanocrystals, each nanocrystals having a surface; and halometallate ligands bound to the surfaces of the Group II-VI nanocrystals, wherein the halometallate ligands are anions having one of the formulas $MX_3^-$, $MX_4^-$, and $MX_4^{2-}$, where M is an element selected from group 12 of the periodic table and X is a halide atom.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawing.

DETAILED DESCRIPTION

Halometallate-capped semiconductor nanocrystals and methods for making the halometallate-capped semiconductor nanocrystals are provided. Also provided are methods of using solutions of the halometallate-capped semiconductor nanocrystals (referred to herein as halometallate-capped NC inks) as precursors for the formation of semiconductor films and devices incorporating the films as active layers.

The halometallate-capped semiconductor nanocrystals are semiconductor nanocrystals having halometallate ligands bound to their surfaces. The halometallate ligands help to passivate the surfaces of the nanocrystals and facilitate electronic communication between the nanocrystals. In addition, in some embodiments of the halometallate ligand-capped semiconductor nanocrystals, the halometallate ligands act as grain growth promoters during the annealing and sintering of the nanocrystals. In these embodiments, the halometallate ligand-capped semiconductor nanocrystals combine a grain growth promoter and a semiconductor material into a single entity, which enables facile device fabrication and eliminates the need for a conventional halometallate bath treatment. This is advantageous because such treatments, which have been used to improve the efficiencies of solution-processed Group II-VI-based photovoltaics, are tedious, inefficient, and difficult to incorporate into coating methods, such as spray-coating and doctor-blade coating, that provide continuous stream processing and facilitate roll-to-roll fabrication techniques. As a result, the halometallate-capped NC inks can be used to form active layers in a variety of photonic and electronic devices, including solar cells and field effect transistors (FETs).

Figure 1A:
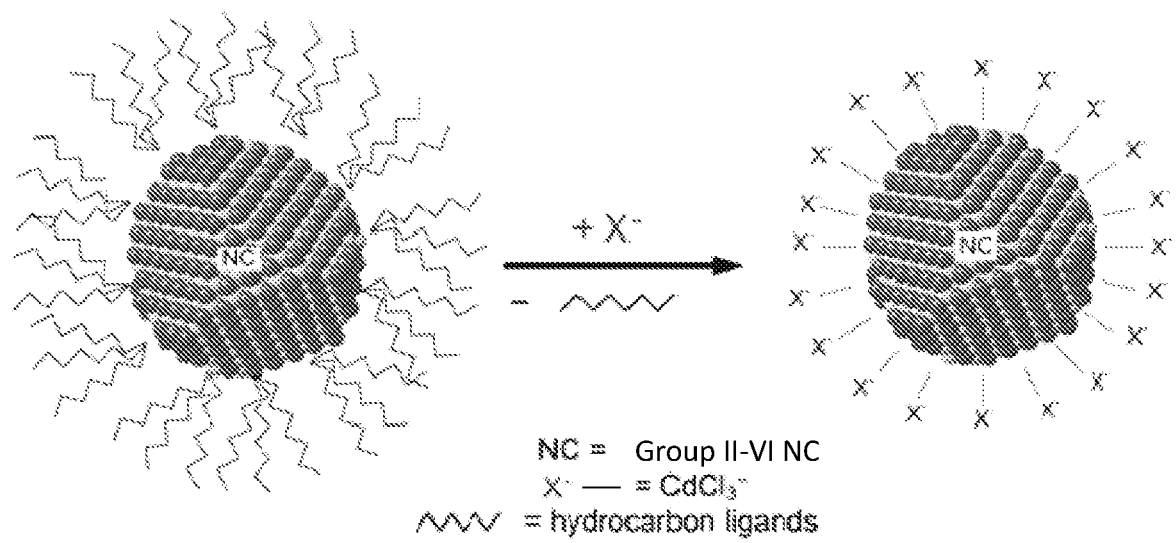
FIG. 1A is a schematic illustration of a $CdCl_3^-$ ligand exchange.

As shown schematically in FIG. 1A, the halometallate ligand-capped semiconductor nanocrystals (shown on the right side of FIG. 1A) can be made by replacing some, all, or substantially all of the surface capping organic ligands on organic ligand-capped semiconductor nanocrystals (shown on the left side of FIG. 1A) with halometallate anions. The organic surface capping ligands may be present by virtue of the solution phase, colloidal synthesis of the semiconductor nanocrystals. These organic ligands can include hydrocarbon chains of various lengths and have one end bound to the surface of the nanocrystal. Examples of organic surface capping ligands that initially may be bound to the nanocrystals include organic amines, carboxylates, and phosphonates. Specific examples of these include tetradecylphosphonic acid and oleates.

Examples of semiconductor nanocrystals that can be surface capped with the halometallate anions include Group II-VI nanocrystals, such as CdTe nanocrystals, HgSe nanocrystals, HgTe nanocrystals, HgS nanocrystals, $Hg_xCd_{1-x}Te$ nanocrystals, $Hg_xCd_{1-x}S$ nanocrystals, $Hg_xCd_{1-x}Se$ nanocrystals, $Cd_xZn_{1-x}Te$ nanocrystals, $Cd_xZn_{1-x}Se$ nanocrystals, $Cd_xZn_{1-x}S$ nanocrystals, CdSe nanocrystals, CdS nanocrystals, ZnS nanocrystals, ZnSe nanocrystals, ZnTe nanocrystals, or mixtures of two or more thereof, where $0 \le x \le 1$, including where $0 < x < 1$. Other examples of semiconductor nanocrystals that can be surface capped with the halometallate anions include Group IV-VI nanocrystals, such as PbS, PbSe, and PbTe. Core-shell nanocrystals having a Group II-VI semiconductor shell or a Group IV-VI semiconductor shell can also be used. The Group II-VI and Group IV-VI shell materials can be, for example, selected from those listed above. Suitable core-shell nanocrystals include those having a Group III-V semiconductor core with a Group II-VI semiconductor shell. For example InAs(core)-II-VI semiconductor (shell) nanocrystals can be used.

Examples of halometallate anions that can be used as surface capping ligands include halometallates, such as chlorometallates, of metals from group 12 and/or group 13 of the periodic table of the elements. The chlorometallates may be represented by one of the formulas $MX_3^-$, $MX_4^-$, and $MX_4^{2-}$, where M is a metal from group 12 or group 13 and X is a halide, such as Cl or I. Specific examples of these include $CdCl_3^-$ anions, $CdCl_4^{2-}$ anions, $CdI_3^-$ anions, $CdBr_3^-$ anions, $CdBr_4^{2-}$ anions, $InCl_4^-$ anions, $HgCl_3^-$ anions, $ZnCl_3^-$ anions, $ZnCl_4^{2-}$ anions, and $ZnBr_4^{2-}$ anions. The halometallate anions are desirably selected so that they act as grain growth promoters during the sintering of the semiconductor nanocrystals into a thin film. The chloride, or other halogen, in the grain growth promoters serves as a flux during the annealing the films and result in the growth of larger grains relative to films that are annealed in the absence of the halometallate ligands. Without intending to be bound by any particular theory of the invention, the inventors believe that the halide that remains in the film is pushed to the grain boundaries as the grains grow. By including halometallate ligands that act as grain growth promoters, sintered semiconductor films having mean grain sizes of 100 nm or greater can be formed. This includes semiconductor films having mean grain sizes of 200 nm or greater and further includes semiconductor films having mean grain sizes of 300 nm or greater. By way of illustration, chlorocadmate anions ($CdCl_3^-$) can be used as grain growth promoting ligands for Group II-VI nanocrystals, such as CdTe nanocrystals, as illustrated in Examples 1-3. However, the halometallate anions need not be grain growth promoters. Although, it may be advantageous to select halometallates that do not inhibit the growth of the semiconductor grains during sintering.

The exchange of the organic capping ligands with halometallate ligands can be carried out by forming a solution containing the organic ligand-capped semiconductor nanocrystals and the halometallate anions and maintaining the solution under conditions that allow the halometallate anions to undergo ligand exchange with the organic capping ligands. The total replacement of all organic capping ligands is not necessary. However, a majority of the organic capping ligands are desirably replaced. For example, from 99% to 100%, including from 99.5% to 100% of the organic capping ligands may be replaced. This can be accomplished by forming two immiscible solutions, the first solution containing the organic ligand-capped semiconductor nanocrystals and the second solution containing the halometallate anions. The second solution will generally also include counter-cations associated with the halometallate anions. Examples of counter-cations include ammonium cations, alkylammonium cations, and arylammonium cations, such as $NH_4^+$, $CH_3NH_3^+$, and $C_5H_6N^+$. The two immiscible solutions can then be combined with optional heating, and then stirred for a time sufficient to allow the nanocrystals to phase transfer to the second solution where ligand exchange takes place. The ligand-exchanged nanocrystals can then be separated from the solution and collected by, for example, precipitating them from the solution, followed by centrifugation and/or filtration. Methods of exchanging organic capping ligands with halometallate ligands are described in greater detail in the Examples.

Figure 1B:
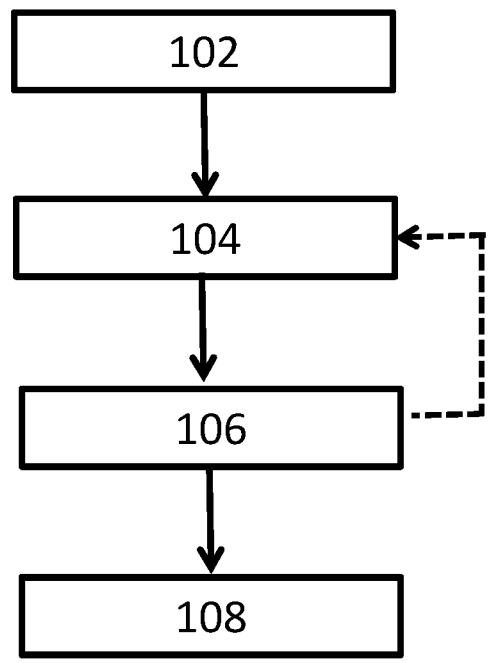
FIG. 1B is a schematic illustration of a method for making a photonic or electronic device comprising an active layer made from $CdCl_3^-$ ligand-capped semiconductor nanocrystals.

As illustrated in the flow chart of FIG. 1B, solutions of the halometallate-capped semiconductor nanocrystals (i.e., "halometallate-capped NC inks") 102 can be used to form films of the semiconductor materials for use as active layers in a variety of devices. The phase transfer solution in which the halometallate-capped nanocrystals are initially formed can be used as an ink. Alternatively, the halometallate-capped nanocrystals can be separated from the phase transfer solution and then redispersed in another solution to provide a halometallate-capped NC ink. Examples of organic solvents in which the halometallate-capped nanocrystals can be redispersed include the organic solvents pyridine, propylene carbonate, and N-methylformamide (NMF), and mixtures of one or more thereof with an alcohol, such as 1-propanol and/or methanol. Once the halometallate-capped NC ink has been formed, it can be coated onto the surface of a device substrate 104. The coating process can be carried out using either continuous or batch methods, such as spray-coating, doctor-blading, or spin-coating, as illustrated in Example 3. The coating can then be annealed at an elevated temperature 106 to promote semiconductor recrystallization and grain growth. By way of illustration only, in some embodiments of the methods, the coatings are annealed at temperatures in the range from about 300° C. to about 400° C. Annealing can be carried out, for example, using a hot plate or an infrared (IR) light source. The result is a semiconductor film composed of well-connected, sintered semiconductor grains. If the semiconductor nanocrystals are core-shell nanocrystals, the semiconductor shells of the nanocrystals can sinter into a matrix around the nanocrystals cores, which can be preserved intact. For example, core-shell nanocrystals having Group III-V semiconductor cores surrounded by Group II-VI semiconductor shells can be sintered into a semiconductor film composed of the Group III-V cores dispersed in a Group II-VI matrix.

Some embodiments of the methods use Group II-VI semiconductor nanocrystals having a metastable phase, rather than a stable phase or core-shell semiconductor nanocrystals having a metastable phase Group II-VI shell, rather than a stable phase Group II-VI shell. For example the nanocrystals, or their shells, may have a metastable wurtzite phase, rather than a stable zinc-blende phase. This is advantageous because the recrystallization and grain growth of the metastable nanocrystals is more efficient during sintering than the recrystallization and grain growth of the corresponding stable phase nanocrystals.

The coating 104 and annealing 106 steps can be repeated a plurality of times to form a film of the desired thickness. Thus, the present methods can be used to tailor the film thickness of the semiconductor layers. By way of illustration, semiconductor films having thicknesses of 600 nm or lower can be made. This includes semiconductor films having thicknesses of 500 nm or lower and semiconductor films having thicknesses of 300 nm or lower (e.g., in the range from 100 nm to 600 nm). Notably, the methods are able to make ultrathin films—including films of the semiconductor having thicknesses of 200 nm or lower or even 100 nm or lower with semiconductor mean grain sizes of 100 nm or greater.

The sintered semiconductor films are highly uniform and can be produced with a low defect density relative to semiconductor films made using a halometallate bath treatment, such as a $CdCl_2$ treatment. Without intending to be bound to any theory of the invention, the inventors believe this is because the halometallate ligands on the semiconductor nanocrystals take up considerably less space than do the residual long-chain organic ligands that are removed during a $CdCl_2$ treatment. Therefore, the present films undergo a smaller volume contraction during sintering, which leads to fewer defects in the sintered films.

Once the semiconductor film has been formed, downstream processing 108 can be used to incorporate the semiconductor film into a photonic device, such as a photovoltaic cell, or an electronic device, such as an FET. Other devices into which the semiconductor films can be incorporated as active materials include infrared photodetectors, including those in which the semiconductor film is, for example, a $Hg_{1-x}Cd_xTe$ film; and high energy photon detectors, such as x-ray and gamma-ray detectors, including those in which the semiconductor film is, for example, a $Cd_{1-x}Zn_xTe$ film. The basic components of these devices include: a first electrode comprising an electrically conductive material; a second electrode comprising an electrically conductive material; and a photoactive material or electrically active material comprising the semiconductor film in electrical communication with the first electrode and the second electrode.

Figure 3A:
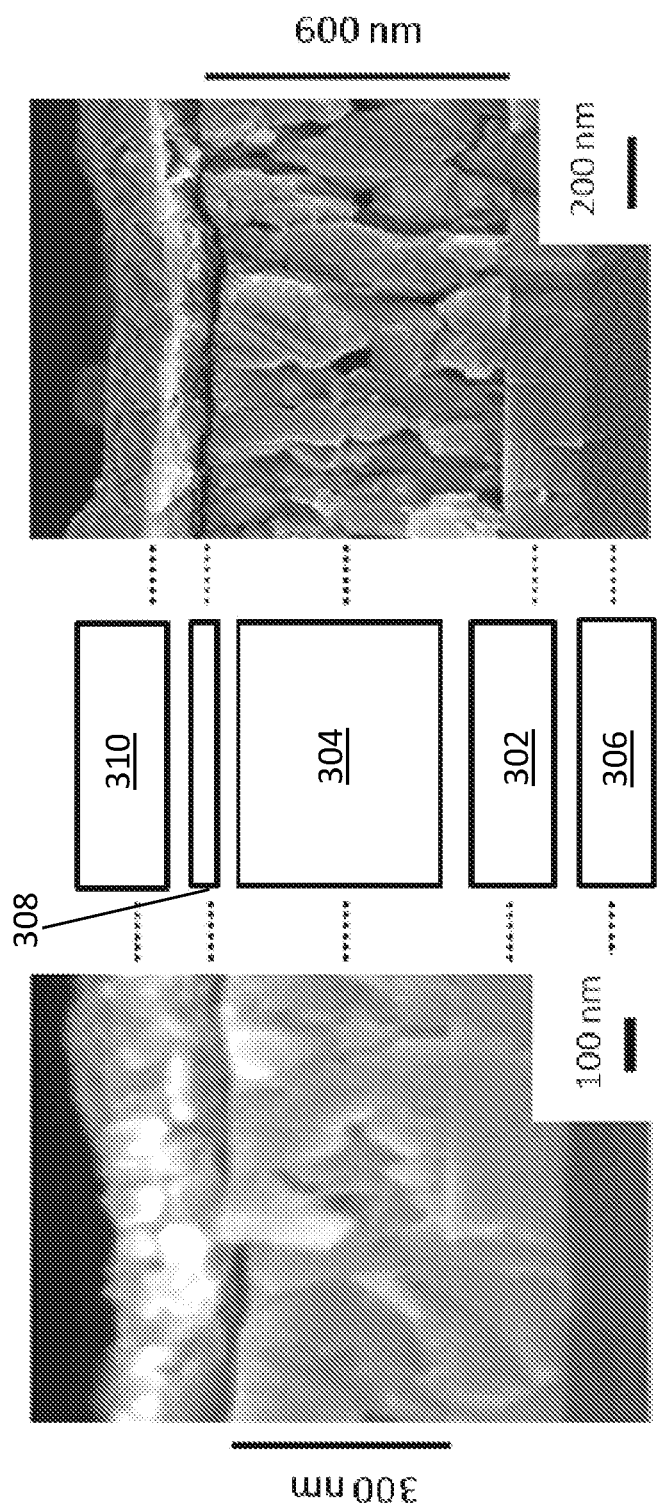
FIG. 3A shows a schematic exploded view (middle panel) and cross-sectional SEM images of a complete CdTe solar cell device made from a $CdCl_3^-$-capped CdTe nanocrystal ink with ~350 nm (left panel) and 600 nm thick (right panel) photoactive CdTe layers.

The basic components of a photovoltaic cell into which the semiconductor films can be incorporated include: a first electrode; a second electrode; and a layer of photoactive material comprising the semiconductor film disposed between and in electrical communication with the first and second electrodes. The middle panel of FIG. 3A is a schematic diagram showing an exploded view of the layers of one embodiment of a photovoltaic cell that can be made using the present methods. As described in detail in Example 2, the photovoltaic cell can be fabricated by coating a solution of the halometallate ligand-capped semiconductor nanocrystals onto the surface of an electrode 302, such as an indium tin oxide (ITO) electrode and annealing the coating to sinter the nanocrystals into a semiconductor film 304. This film provides the photoactive layer of the photovoltaic cell, which absorbs light, such as sunlight, and generates electron-hole pairs. In the embodiment of FIG. 3A, ITO electrode 302 is a thin layer of ITO on the surface of a glass substrate 306. To finish the device, a layer of charge transporting material 308, such as ZnO, is applied over the annealed film and a top electrode 310, such as an aluminum electrode, is deposited over the ZnO (panel (d)). Although this particular example of a photovoltaic cell is illustrated with selected material layers, other materials can be used. For example, the charge transporting layer can take the form of a porous film of other semiconducting materials, such as titanium dioxide nanoparticles, and other metals, metal alloys, or transparent conductive oxides can be used as electrode materials. In addition, other layers commonly used in thin film photovoltaic cells, such as electron transport layers, hole blocking layers, and the like, may also be incorporated into the photovoltaic cells.

Photovoltaic cells comprising light-absorbing layers formed from the semiconductor film can have high power conversion efficiencies. For example, photovoltaic cells having power conversion efficiencies under simulated full sunlight of AM 1.5G, 100 mW cm$^{-2}$ of at least 5, at least 8 and at least 10% can be fabricated. These power conversion efficiencies can be obtained using very thin light-absorbing layers of 600 nm or less, including light-absorbing layers having a thickness of 400 nm or less. Methods for determining the power conversion efficiency of a solar cell are provided in the Examples.

The basic components of an FET into which the semiconductor films can be incorporated include: a source electrode; a drain electrode; a gate electrode; a conducting channel in electrical contact with the source electrode and the drain electrode, the conducting channel comprising the semiconductor film; and a gate dielectric disposed between the gate electrode and the conducting channel. As described in detail in Example 2, the FET can be fabricated by coating a solution of the halometallate ligand-capped semiconductor nanocrystals onto the surface of a gate dielectric layer, such as an $SiO_2$ dielectric, and annealing the coating to sinter the nanocrystals into a semiconductor film. This film provides the conducting channel layer of the FET. The source and drain electrodes can then be formed on the conducting channel layer. The gate electrode can be formed on the gate dielectric before or after the formation of the semiconductor film.

The following examples illustrate the capping of CdTe nanocrystals with $CdCl_3^-$ ligands and $HgCl_3^-$ ligands, the capping of HgSe nanocrystals with $CdCl_3^-$ ligands, the capping of HgTe nanocrystals with $CdI_3^-$ ligands, and CdTe film formations using the $CdCl_3^-$ ligand-capped CdTe nanocrystals. However, it should be understood that the methods described in the examples can also be used to make other halometallate-capped semiconductor nanocrystals and other semiconductor films, consistent with the description provided above. By way of illustration only, the methods can be extended to the creation of mercury cadmium telluride (MCT) thin films. For example, CdTe, HgTe, or $Hg_xCd_{1-x}Te$ nanocrystals can be capped with halomercurate or halocadmate ligands (e.g., $HgCl_3^-$, $HgBr_3^-$, $HgI_3^-$, $CdCl_3^-$, $CdBr_3^-$, or $CdI_3^-$) to form a colloidal solution in a polar solvent. This solution can then be deposited onto a substrate and annealed at 200-300° C. to form a polycrystalline MCT thin film comprising grains of the semiconductor. This library of nanocrystal and ligand compositions allows the composition of the resulting $Hg_xCd_{1-x}Te$ alloy to be varied from x=0 to x=1 with a high degree of control. The resulting semiconductor films can have bandgaps ranging from 0 eV to 1.5 eV and devices made from these films can be used as photodetectors from the visible through long-wave infrared (LWIR). For at least some applications, this solution-processed approach may be preferable to traditional methods of MCT fabrication, including liquid-phase epitaxy (LPE) or molecular beam epitaxy (MBE). These epitaxial techniques require extreme conditions (high temperature and/or high vacuum) and very expensive lattice-matched single crystalline substrates. In contrast, the halometallate-capped nanocrystal solutions can be drop-cast on a wide variety of substrates (silicon, glass, high-temperature plastic, etc.) and annealed at mild temperatures.

EXAMPLES

Example 1

This example illustrates methods of making $CdCl_3^-$ ligand-capped CdTe nanocrystals and solar cells incorporating the nanocrystals as a photoactive material. CdTe is used here as an illustrative group II-IV material. The methods described herein can also be applied to other semiconductor nanocrystals, including other group II-IV semiconductors.

Additional details for methods of making $CdCl_3^-$ ligand-capped CdTe nanocrystals and solar cells incorporating the nanocrystals as a photoactive material can be found in Zhang et al., *J. Am. Chem. Soc.*, 2016, 138 (24), pp 7464-7467 and its supporting information, which are incorporated herein by reference.

Experimental Procedure

Ordered Chemicals and Purification. 99.99% trace metal cadmium oxide, cadmium chloride and ammonium chloride, 90% technical grade oleic acid (OA) and 1-octadecene (ODE), 99.5% by redistillation ethanolamine, 98% pyridinium hydrochloride, 97% tributylphosphine with isomers (TBP), 99.999% indium chloride, 99.999% tellurium shot, 99% hexamethylphosphoramide (HMPA) and anhydrous hexane, toluene, ethanol, methanol, acetonitrile, pyridine (Pyr), N-methylformamide (NMF), propylene carbonate (PC), 1-propanol (1-PA) and 2-methoxyethanol were purchased from Sigma-Aldrich. Certified ACS acetone, methanol and 2-propanol (IPA) were purchased from Thermo Fisher Scientific. 10 wt % TBP:Te was prepared by dissolving 10 g Te shot in 90 g TBP overnight. ODE and OA were recrystallized by cooling the bottle in a chiller overnight to 12° and 18° C., respectively, and decanted to remove impurities. Pyr and 1-PA were distilled to remove low and high boiling point impurities attributed to morphological issues in spin-coated films. NMF was dried prior to use in the glovebox.

Nanocrystal Synthesis. 4.80 g CdO, 42.4 g recrystallized OA and 40.0 g recrystallized ODE were charged in a 500 mL flask and evacuated overnight to remove trace oxygen. The flask was heated to 800° C. until the pressure equilibrated. Under dry nitrogen, the mixture was heated to 2200° C. until the solution turned clear, indicating a completed reaction. The flask was cooled to <900° C. and evacuated. The flask was heated to 110° once the solution stopped bubbling and left until the pressure equilibrated. Under dry nitrogen, the flask was heated to 270° C. and 24 mL of 10 wt % TBP:Te was injected. The heating mantle was removed immediately and the flask was allowed to air cool to <50° C. The resulting CdTe nanocrystal (NC) solution was split evenly between 8 centrifuge tubes and taken into a dry nitrogen glove box. The NCs were purified using anhydrous solvents in the glove box. Ethanol was used as a non-solvent with toluene as the solvent. The standard method of adding non-solvent to the NC solution, precipitate using a centrifuge, decant and dissolve in solvent was utilized to achieve a high purity. Following the final wash, the NCs were dissolved in hexane at a concentration of ~80 mg/mL.

Halometallate Ligand Exchange. Halometallates with $NH_4^+$ or $C_5H_6N^+$ cations were synthesized by mixing equimolar amount of $CdCl_2$ and $NH_4Cl$ or $C_5H_6NCl$ in NMF (0.1 M). In a typical ligand exchange, 3 mL of CdTe NC solution in hexane (~30 mg/mL) was mixed with 3 mL of $CdCl_3$ solution in NMF (0.05 M). Under vigorous stirring, the NCs gradually transferred from hexane to NMF. Typically, it took up to 8 hours until a complete phase transfer, resulting in a colorless hexane phase. The time required for ligand exchange is strongly dependent on the concentration of NCs, and also affected by the cations of halometallates. A much shorter time (within 30 minutes) is required for CdTe NCs with a lower concentration (5 mg/mL). The bottom phase containing CdTe NCs was then rinsed with fresh hexane three times, followed by the flocculation of NC solution in NMF by adding a mixture of toluene (1 mL) and HMPA (0.5 mL). The NC precipitates were collected by centrifugation, and re-dispersed in 1 mL pyridine.

The dispersion of $CdCl_3^-$-capped CdTe NCs in pyridine was vigorously mixed by stirring for >1 h, followed by centrifugation to remove the insoluble part. The concentration of the stable solution can be as high as 70-80 mg/mL. In pyridine, $CdCl_3^-$-capped NCs with $C_5H_6N^+$ cations showed a slightly higher solubility than those with $NH_4^+$, presumably due to the compatibility of the cation and the solvent. These concentrated solutions were deployed as soluble precursors for sintered CdTe solar cells by spin-coating or spray-coating. The $CdCl_3^-$-capped NCs also disperse well in propylene carbonate (PC).

Standard Solar Cell Fabrication. For purposes of comparison, the fabrication of a solar cell using a standard approach is described here. A more detailed description is provided in Example 2. 25 mm×25 mm ITO-coated glass substrates were purchased from Thin Film Devices Inc. The substrates were sonicated in deionized water (DI) and Alconox detergent and thoroughly rinsed with DI. The substrates were then sonicated in DI, acetone, IPA and DI individually. Following the last DI step, the substrates were dried using nitrogen and oxygen-plasma treated for 10 minutes using a Harrick PDC-001 Extended Plasma Cleaner. ZnO sol-gel was prepared by sonicating 1.50 g zinc acetate dihydrate, 15 mL 2-methoxyethanol, 420 µL ethanolamine and 15-45 mg $InCl_3$ together for 1 hour and stirring overnight. The CdTe NC stock solution was purified one more time using hexane as a non-solvent and dissolved in a 50:50 mixture of Pyr and 1-PA to the desired concentration. The solution was sonicated for 10 minutes and filtered using a 0.2 µm PTFE syringe filter. The cleaned CdTe NC solution was spin-coated onto a cleaned substrate, dried at 150° C. for 2 minutes and air cooled. The substrate was dipped in a saturated $CdCl_2$ bath for 15 seconds, thoroughly rinsed with IPA and dried under nitrogen flow. The substrate was annealed at 350° C. for 20 seconds and allowed to cool. The process was repeated until the desired thickness was achieved. Following the last layer, ZnO sol-gel was spin-coated on top, and the substrate was annealed at 300° C. for 2 minutes and cooled. The substrates were transferred into a glove box and held under high vacuum overnight. The substrates were masked using a homemade substrate holder with 8 $mm^2$ holes evenly distributed on the interior of the substrate. 100 nm of Al and Ag each were deposited as the top electrode. Three sides of each substrate were scratched off to expose the ITO. Good electrical contact were established using colloidal Ag paint from Ted Pella Inc.

Solar Cell Testing. The AM1.5 solar spectrum was created using a Newport model 67005 Xenon lamp and solar filter. The light was calibrated using a Hamamatsu Inc, S1787-04 Si solar cell fitted into a homemade testing apparatus. The substrates were tested using a Keithley 2400 electrometer controlled with homemade Labview software. The substrates were covered with an aperture mask with 6 $mm^2$ holes evenly distributed to supply a controlled amount of light to each pixel and remove uncertainty in illumination area.

Example 2

In this example, chlorocadmate ($CdCl_3^-$) ligand chemistry was used to design a new CdTe NC ink for solution-processed solar cells. In this ink, $CdCl_3^-$ ligands play a dual role: i) replace the organic ligands on CdTe NCs and afford a high solubility of NCs in a suitable solvent; and ii) promote CdTe grain growth. CdTe NCs in this ink can efficiently sinter and grow into large grains. Moreover, chloride ions provide selective electronic doping of grain boundaries that helps to separate charge carriers in CdTe solar cells.

Figure 2A:
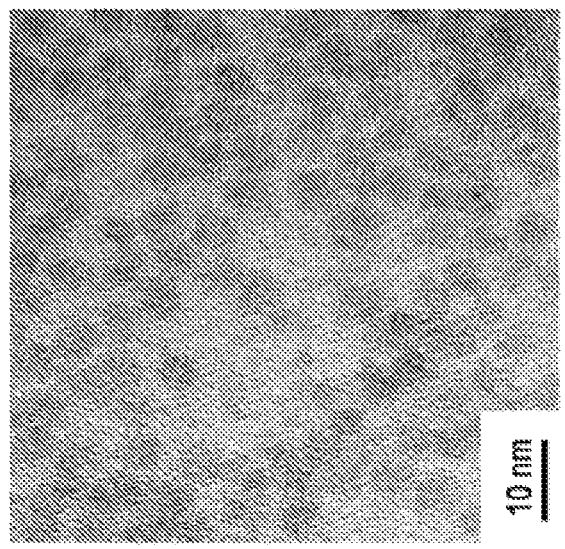
FIG. 2A is a transmission electron microscope (TEM) image of CdTe nanocrystals capped with tetradecylphosphonic acid.
Figure 2B:
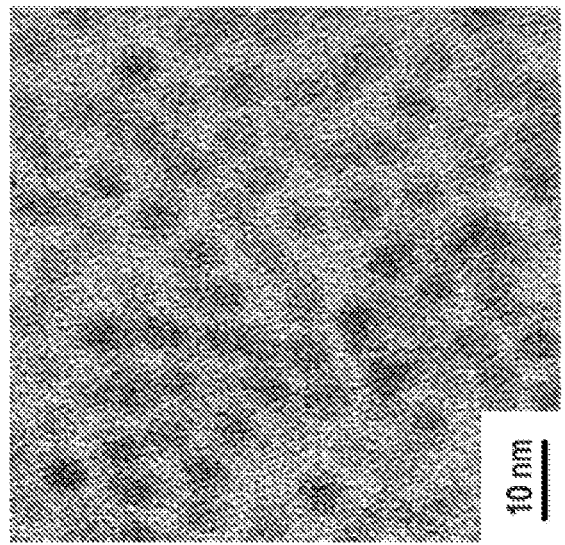
FIG. 2B is a TEM image of CdTe nanocrystals capped with $CdCl_3^-$ ($NH_4CdCl_3$) ligands.
Figures 2C, 2D:
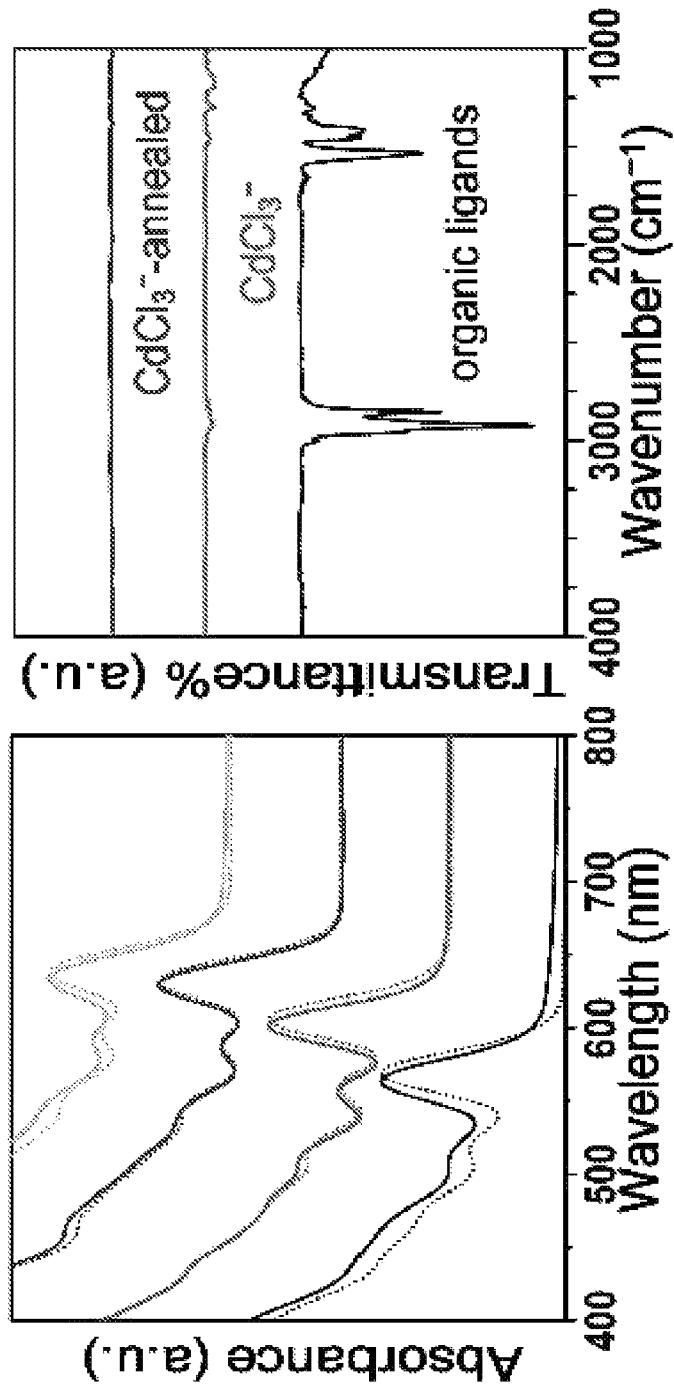
FIG. 2C shows ultraviolet (UV)-visible spectra of CdTe nanocrystals of various sizes capped with tetradecylphosphonic acid (dotted lines) and $CdCl_3$ ligands (solid lines).
FIG. 2D shows Fourier transform infrared (FTIR) spectra of CdTe nanocrystals capped with native oleate ligands and with $CdCl_3^-$ ligands.

Preparing the ink involved the exchange of insulating, long hydrocarbon ligands with $CdCl_3^-$. Spherical CdTe NCs (FIG. 2A) were synthesized using tetradecylphosphonic acid (TDPA) in accordance with reported methods (Yu, W. W.; Qu, L.; Guo, W.; Peng, X. Chem. Mater. 2003, 15, 2854). For ligand exchange, CdTe NCs dissolved in hexane were combined with a solution of $NH_4CdCl_3$ in N-methylformamide (NMF). These two immiscible phases were stirred until CdTe NCs transferred to NMF and formed a stable colloid. After purification, the ligand-exchanged CdTe NCs can redisperse in several solvents, including NMF, propylene carbonate, and pyridine. $NH_4CdCl_3$-capped NCs were colloidally stable as $CdCl_3^-$ (and other anions generated by self-ionization) bound to the NC surface and provided electrostatic repulsion to overpower the interparticle van der Waals attractive force. The binding of negatively charged $CdCl_3^-$ anions to NC surface was confirmed by the negative zeta-potential (−34 mV) of $NH_4CdCl_3$-capped CdTe NCs in propylene carbonate. Transmission electron microscopy (TEM) images (FIG. 2B) indicated that NCs retained their size and morphology. The integrity of CdTe NC cores after ligand exchange was also demonstrated by the optical absorption spectra. The absorption spectra (FIG. 2C) of $CdCl_3^-$-capped CdTe NCs of various sizes resembled those of TDPA-capped ones. The ligand exchange procedure using $NH_4CdCl_3$ can be extended to CdTe NCs with other organic surfactants or morphologies (e.g., oleate-capped CdTe tetrapods) and, more importantly, performed on a large scale. An ink containing several grams of $CdCl_3^-$-capped CdTe NCs can be made in a single batch. The completeness of ligand exchange on such a large scale was monitored by Fourier transform infrared (FTIR) spectroscopy. The vibrational peaks observed in FTIR (FIG. 1F) arising from native organic ligands (e.g., 2800-3000 $cm^{-1}$ for C—H stretching mode, 1300-1500 $cm^{-1}$ for C—H bending) were drastically suppressed in NCs with $CdCl_3^-$ ligands. The weak IR features for $CdCl_3^-$-capped CdTe NCs could be assigned to solvent residue and counterions, as they disappeared after mild annealing (200° C. under vacuum). Besides $NH_4CdCl_3$, $CdCl_3^-$ moieties with other cations can also behave as ligands for CdTe NCs. For instance, reacting an equimolar mixture of $CdCl_2$ and pyridinium hydrochloride in NMF resulted in soluble species containing $CdCl_3^-$ and $C_5H_5NH^+$. CdTe NCs capped with this compound (further referred to as pyrHCdCl$_3$) showed similar UV-visible absorption features to those capped with $NH_4CdCl_3$. Moreover, pyrHCdCl$_3$ allowed a higher solubility (up to 150 mg/mL) of CdTe NCs in low boiling point solvents (pyridine, its mixture with alcohols, and nearly pure alcohols with several percent pyridine), which was crucial for the solution-based fabrication of high quality CdTe thin films.

In this ink, the surface-bound $CdCl_3^-$ molecules play a vital role as the grain growth promoter of CdTe NCs. CdTe NCs before and after $CdCl_3^-$ ligand exchange showed significantly different sintering behavior, as evidenced by then XRD patterns. Broad peaks (centered at ~39°, ~42.5°, and 46.5°) with low intensities were observed in the case of as-synthesized CdTe NCs, corresponding to small CdTe grains (diameter about 5 nm). The native organic ligands inhibited the sintering of NCs, even at high temperatures, as indicated by the minor changes in intensities and widths of XRD peaks. Exchanging native oleate ligands for pyridine did not result in a significant promotion of CdTe grain growth upon the heat treatment. In contrast, the grain growth in $CdCl_3^-$-capped CdTe NCs was considerably enhanced, as evidenced by the high intensities and narrowing of the XRD peaks starting from ~250° C. Concomitantly, a characteristic peak for wurtzite phase (~42.5°) disappeared, indicating a complete transition to a zinc-blende phase. As further evidence of grain growth, scanning electron microscopy (SEM) images of an annealed, single-layer CdTe film deposited from $CdCl_3^-$-capped CdTe NC ink revealed a uniform film of well-connected, sintered CdTe grains. Cross-sectional SEM (FIG. 3A; left and right panels) of the complete CdTe device also showed a CdTe layer composed of sintered grains comparable in size to the thickness of the entire absorber film.

Figures 3B, 3C, 3D:
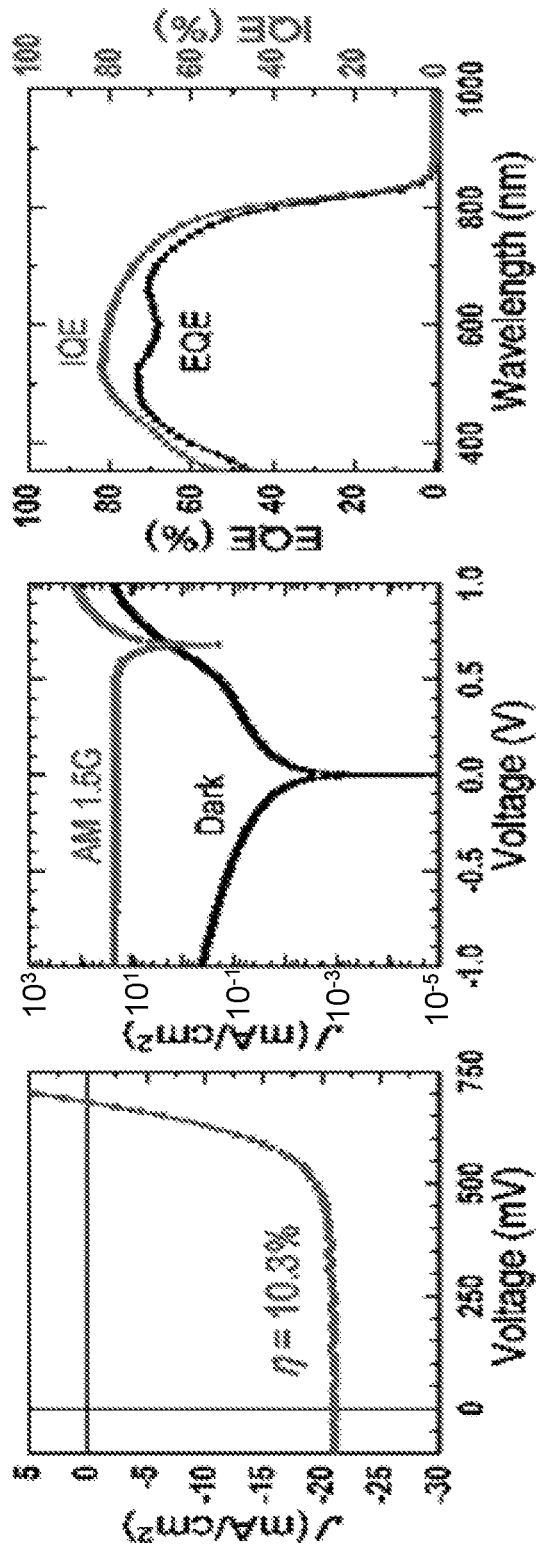
FIG. 3B shows a current density-voltage (JV) curve under AM 1.5G illumination for a CdTe solar cell with a ~350 nm thick CdTe active layer.
FIG. 3C shows the light and dark JV curves under AM 1.5G illumination for a CdTe solar cell with a ~350 nm thick CdTe active layer.
FIG. 3D shows the light external quantum efficiency (EQE) and internal quantum efficiency (IQE) spectra for a CdTe solar cell with a ~350 nm thick CdTe active layer.
Figures 3E, 3F, 3G:
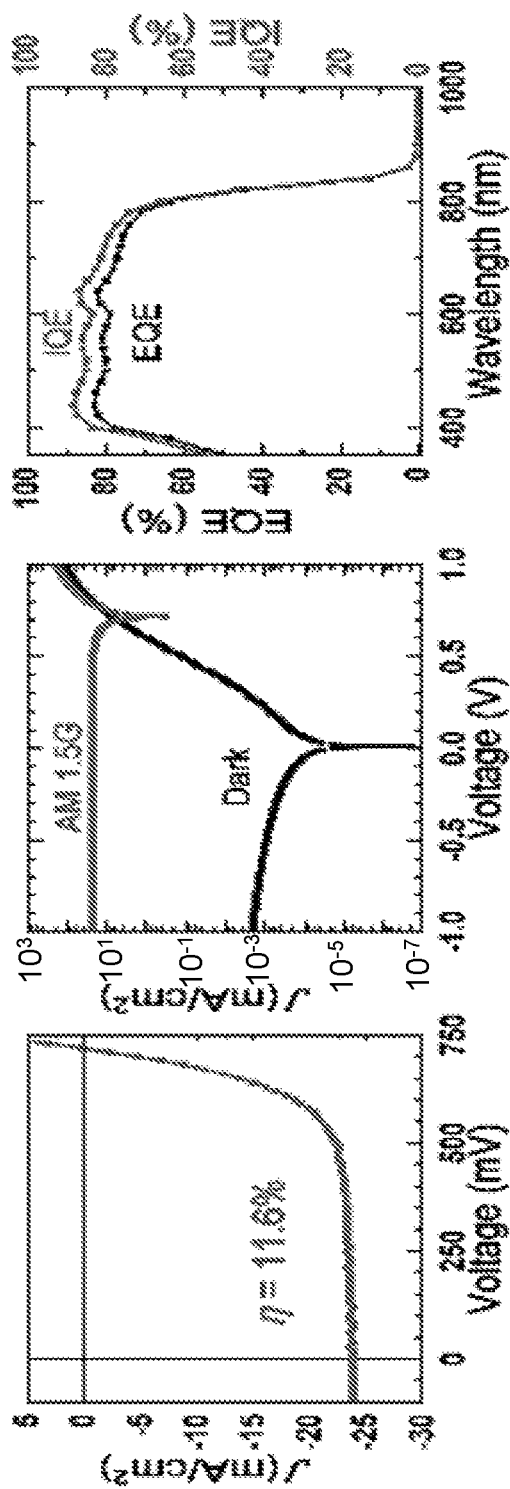
FIG. 3E shows a JV curve under AM 1.5G illumination for a CdTe solar cell with a ~600 nm thick CdTe active layer.
FIG. 3F shows the light and dark JV curves under AM 1.5G illumination for a CdTe solar cell with a ~600 nm thick CdTe active layer.
FIG. 3G shows the EQE and IQE spectra for a CdTe solar cell with a ~600 nm thick CdTe active layer.

Prior to the design of $CdCl_3^-$-capped CdTe NC ink, the use of CdTe NCs with several other inorganic surface ligands, including $Cl^-$, $Te^{2-}$, and $CdTe_2^{2-}$, was attempted (Nag, A.; Kovalenko, M. V.; Lee, J.-S.; Liu, W.; Spokoyny, B.; Talapin, D. V. *J. Am. Soc. Chem.* 2011, 133, 10612; Zhang, H.; Jang, J.; Liu, W.; Talapin, D. V. *ACS Nano* 2014, 8, 7359; Norman, Z. M.; Anderson, N. C.; Owen, J. S. *ACS Nano* 2014, 8, 7513; Ning, Z.; Dong, H.; Zhang, Q.; Voznyy, O.; Sargent, E. H. *ACS Nano* 2014, 8, 10321; Fafarman, A. T.; Koh, W.-K.; Diroll, B. T.; Kim, D. K.; Ko, D.-K.; Oh, S. J.; Ye, X.; Doan-Nguyen, V.; Crump, M. R.; Reifsnyder, D. C.; Murray, C. B.; Kagan, C. R. *J. Am. Soc. Chem.* 2012, 133, 15753; Dolzhnikov, D., S.; Zhang, H.; Jang, J.; Son, J. S.; Panthani, M. G.; Chattopadhyay, S.; Shibata, T.; Talapin, D. V. *Science* 2015, 347, 425). The simple halide, $Cl^-$, failed to afford highly concentrated, stable colloidal solution of CdTe NCs (solubility<30 mg/mL), which is a prerequisite for solution-processed solar cells. CdTe NCs capped with $Te^{2-}$ and $CdTe_2^{2-}$ sintered after annealing without $CdCl_2$ treatment, but had been too air sensitive. Besides, adding $CdCl_2$ to pyridine-exchanged CdTe NCs (referred to as the "additive approach") was unable to remove the organic ligands and led to poor device performance. In comparison, the robust $CdCl_3^-$-capped CdTe NC ink in a mixture of pyridine and 1-propanol can be processed in air and produced high quality CdTe layers using a layer-by-layer approach without additional $CdCl_2$ treatment. By using a device architecture outlined in FIG. 3A (middle panel) and current/light soaking (Panthani, M. G.; Kurley, J. M.; Crisp, R. W.; Dietz, T. C.; Ezzyat, T.; Luther, J. M.; Talapin, D. V. *Nano Lett.* 2014, 14, 670), solar cells with a ~350 nm thick CdTe absorber were fabricated and showed a PCE of 10.3% with short-circuit current density ($J_{SC}$), open-circuit voltage ($V_{OC}$), and fill factor (FF) of ~21 mA/cm², ~690 mV, and ~70%, respectively (FIG. 3B and Table 1). The average values achieved were ~9%, ~20 mA/cm², ~670 mV, and ~68% for PCE, $J_{SC}$, $V_{OC}$, and FF, respectively. The photocurrent collected on each single CdTe solar cell device (area: 8 mm²) was generated by an incident light exposed to an area of 6 mm² using an aperture mask. The external quantum efficiency (EQE) spectrum (FIG. 3D) matched well with the measured $J_{SC}$. Internal quantum efficiency (IQE) (FIG. 3D) was about 10% higher compared to EQE values, consistent with an estimate for light reflection at the air/glass interface. These reasonably high PCE values compared favorably with devices with very thin CdTe layers. Traditional CdTe solar cells use several micron thick CdTe layers, which poses obvious concerns given Te scarcity and Cd toxicity issues. Solution deposition can be easily scaled to different film thickness as shown in FIG. 3A (left and right panels) by simply adjusting the concentration of NC ink and the number of deposited layers. For example, the solar cells with ~600 nm thick CdTe layers had a PCE of 11.6% due to improvements in both $J_{SC}$ (23.7 mA/cm²) and $V_{OC}$ (718 mV), with a FF 68% (FIGS. 3E-G and Table 1). Extensive studies of sputtered ultrathin CdTe solar cells demonstrated an optimized 11% PCE for a 0.5 m thick CdTe layer and 8% record efficiency for devices with a 0.25 m thick CdTe layer due to shunting and incomplete light absorption (Paudel, N. R.; Wieland, K. A.; Compaan, A. D. *Sol. Energ. Mat. Sol. Cells* 2012, 105, 109). Switching from gas-phase to solution deposition clearly helps to improve the uniformity of ultrathin CdTe layer (FIG. 3A) resulting in 10% PCE for devices with sub-400 nm absorber. Improvements can be achieved through the optimization of device stack and deposition conditions, e.g., by annealing the CdTe layers not in air but under controlled atmosphere.

TABLE 1

Summary of performance of CdTe solar cells made from the "standard" approach and the $CdCl_3^-$-capped CdTe NC ink (spin- or spray-coated) under AM 1.5 G illumination.

| Ink | | Deposition Method | CdTe Absorber Thickness (nm) | PCE (%) | $V_{OC}$ (mV) | $J_{SC}$ (mA/cm²) | FF (%) |
|---|---|---|---|---|---|---|---|
| $CdCl_3^-$-capped CdTe NC Ink | Best | Spin-coated | ~350 | 10.3 | 690 | 21.4 | 70 |
| | Typical | | | 9.0 | 670 | 20.0 | 68 |
| $CdCl_3^-$-capped CdTe NC Ink | Best | Spin-coated | ~600 | 11.6 | 718 | 23.7 | 68 |
| | Typical | | | 10.0 | 680 | 22.0 | 67 |
| $CdCl_3^-$-capped CdTe NC Ink | Best | Spray-coated | ~350 | 8.8 | 650 | 21.4 | 63 |
| | Typical | | | 8.0 | 650 | 20.0 | 60 |
| "Standard" | Best | Spin-coated | ~400 | 9.6 | 598 | 22.2 | 72 |
| | Typical | | | 8.0 | 550 | 21.0 | |
| "Standard" | Best | Spin-coated | ~550 | 12.3 | 684 | 25.8 | 71 |
| | Typical | | | 11 | 650 | 24.5 | 69 |

In a series of control experiments, the performance of CdTe solar cells made of CdTe NCs capped with the pyrHCdCl₃ surface ligands were compared to the same batch of NCs, but capped with pyridine. In the latter case, each spin-coated NC layer was soaked in a saturated solution of $CdCl_2$ in methanol before annealing at 350° C. The latter NCs are referred to as having been made by the "standard approach", which is described in more detail in the Detailed Methods Description, below. At comparable thicknesses of CdTe absorber layers, the solar cells made with pyrHCdCl₃ surface ligands showed comparable or higher PCE values, primarily due to a significant increase in $V_{OC}$ (Table 1). This difference in $V_{OC}$ can be ascribed to a better passivation of grain boundaries and reduced Shockley-Read-Hall recombination velocity in the CdTe layer.

The ability to integrate the grain growth promoter in the form of the surface ligands for CdTe NCs made the ink compatible with high throughput deposition methods, such as spray-coating or doctor blading. In preliminary tests for spray-coated solar cells, a PCE (8-9%, Table 1) comparable to spin-coated devices, using $CdCl_3^-$-capped CdTe NC ink in methanol with a small amount of pyridine was achieved.

The $CdCl_3^-$-capped CdSe NCs were used to fabricate field effect transistor (FET) devices. Similar to the case of CdTe, CdSe NCs can disperse in NMF with $NH_4CdCl_3$ ligands without notable changes in the crystal size. $CdCl_3^-$ ligands promoted the grain growth of NCs with respect to other ligands, such as $I^-$. The sintered CdSe nanograins (~20 nm) showed decent electron mobility up to ~30 $cm^2/Vs$, depending on the annealing temperature, estimated from the FET transfer characteristics. More interestingly, the air-stable $CdCl_3^-$ ligands allowed the ligand exchange process and FET channel fabrication, for the first time, to be performed in air, resulting in CdSe FETs with preliminary mobilities of ~2-3 $cm^2/V \cdot s$.

Detailed Methods Description

1. Chemicals

Cadmium oxide (CdO, 99.99+%, trace metal basis), ammonium chloride ($NH_4Cl$, 99.99%), cadmium chloride ($CdCl_2$, 99.99%, trace metal basis), pyridinium hydrochloride ($C_5H_5N \cdot HCl$, 98%), indium chloride ($InCl_3$, 99.999%), tellurium shot (Te, 99.999%), tributylphosphine (TBP, 97% with isomers), trioctylphosphine oxide (TOPO, 99%), oleic acid (OA, technical grade, 90%), oleylamine (OLA, 70%), tetradecylphosphonic acid (TDPA, 97%), 1-octadecene (ODE, technical grade, 90%), ethanolamine (99.5%, redistilled), hexamethylphosphoramide (HMPA, 99%), ethanol (≥99.5%, anhydrous), toluene (≥99.8%, anhydrous), hexane (95%, anhydrous), methanol (99.8%, anhydrous), acetonitrile (99.8%, anhydrous), pyridine (99.8%, anhydrous), propylene carbonate (99.7%, anhydrous), N,N-dimethylformamide (DMF, 99.8%, anhydrous), 1-propanol (1-PA, 99.7%, anhydrous), and 2-methoxyethanol (99.9%, anhydrous) were purchased from Aldrich. N-trioctylphosphine (TOP, 97%) was purchased from Strem. Acetone (certified ACS), methanol (certified ACS), and 2-propanol (IPA, certified ACS) were purchased from Thermo Fisher Scientific. 10 wt % TBP:Te was prepared by dissolving 10 g of Te shot in 90 g of TBP overnight in a $N_2$-filled glove box. ODE and OA were recrystallized by cooling the bottle in a chiller overnight at 12 and 18° C., respectively, and decanted to remove impurities. Pyridine and 1-PA were distilled to remove low and high boiling point impurities. N-methylformamide (NMF, 99%, Alfa Aesar) and OLA were dried prior to use in glove box.

2. Nanocrystal Synthesis

Monodisperse zinc-blende CdTe nanocrystals (NCs) capped with TDPA ligands were synthesized following the reported procedure (Yu, W. W.; Qu, L.; Guo, W.; Peng, X. *Chem. Mater.* 2003, 15, 2854). In brief, CdO (128 mg), TDPA (570 mg), and ODE (39.3 g) were evacuated at 80° C. until equilibrated. Under dry $N_2$, the mixture was heated to 300° C. until all powders dissolved. At this temperature, a solution containing 2.5 g of 10 wt. % TBP:Te, 2.5 g of TBP, and 15 g of ODE was swiftly injected. The reaction mixture immediately turned green and then orange within 30 seconds. Aliquots were taken at 1, 3, 4, and 5 minutes after injection and were quenched by adding toluene. The resulting CdTe NCs were purified using anhydrous solvents in the glove box. NCs were precipitated by a 1:1 mixture of anhydrous methanol and 1-propanol, and redispersed in toluene. Prior to the ligand exchange, NCs were precipitated with ethanol and redispersed in hexane.

Wurtzite CdTe NCs capped with oleate were synthesized with a modified method described in Jasieniak, J.; MacDonald, B. I.; Watkins, S. E.; Mulvaney, P. *Nano Lett.* 2011, 11, 2856; and MacDonald, B. I.; Gengenbach, T. R.; Watkins, S. E.; Mulvaney, P.; Jasieniak, J. J. *Thin Solid Films* 2014, 558, 365. CdO (4.80 g), OA (42.4 g, recrystallized), and ODE (40.0 g, recrystallized) was loaded in a 500 mL three-necked flask and evacuated overnight to remove trace oxygen. Afterward, the flask was heated to 80° C. until the pressure equilibrated. Under dry $N_2$, the mixture was heated to 220° C. until the solution turned clear, indicating a completed reaction to form cadmium oleate ($Cd(OA)_2$). The flask was cooled and dried under vacuum at 110° C. to remove water generated by the reaction. Under dry $N_2$, the flask was heated to 270° C., followed by the quick injection of 24 mL of 10 wt % TBP:Te. Immediately after the injection, the heating mantle was removed and the flask was quickly cooled to room temperature. The resulting CdTe NCs were purified using anhydrous solvents in the glove box. Ethanol was used as the non-solvent while toluene as the solvent. After several precipitation-redispersion cycles with ethanol/toluene, the purified NCs were dissolved in hexane at a concentration of ~80 mg/mL.

Wurtzite CdSe NCs capped with OA were synthesized using $Cd(OA)_2$ as the Cd precursor. In brief, 1.2 g of TOPO, 2.25 mL of 1.0 M $Cd(OA)_2$ solution in OA, and 12 mL of ODE were loaded in a 100 mL three-necked flask and dried under vacuum at 70° C. for 1 hour. Afterward, the solution was heated to 300° C. under $N_2$. A stock solution containing 4 mL of 1.0 M TOPSe solution in TOP and 3 mL of OLA was swiftly injected at 300° C. The mixture was kept at 280° C. for 2-3 minutes and quickly cooled to room temperature. The CdSe NCs can be isolated by adding ethanol to the crude solution followed by centrifugation. CdSe NC precipitates can redisperse in non-polar solvents (e.g., hexane). The washing with ethanol/hexane as non-solvent/solvent was repeated several cycles to remove excess organic ligands. Finally, the purified CdSe NCs were dissolved in hexane.

3. Preparation of CdTe NC Inks a) Pyridine-exchanged CdTe NC Ink

To prepare a soluble CdTe NC ink for fabricating CdTe thin films using the "standard" or "additive" approach, CdTe NC solution in toluene was precipitated with ethanol and redispersed in anhydrous pyridine at a concentration of ~80 mg/mL. The solution of CdTe NCs in pyridine was stirred under $N_2$ overnight on a hotplate set to 100° C., followed by precipitation using hexane. The CdTe NC precipitates were redispersed in fresh pyridine to prepare the "pyridine-exchanged" CdTe NC ink for the "standard" or "additive" approach.

b) Ligand Exchange of CdTe NCs with $CdCl_3^-$ Ligands and Preparation of the $CdCl_3^-$-capped CdTe NC Ink Chlorocadmates ($CdCl_3^-$) with $NH_4^+$ or $C_5H_5NH^+$ cations were synthesized by mixing equimolar amount of $CdCl_2$ and $NH_4Cl$ or $C_5H_5N \cdot HCl$ in NMF (0.1 M). In a typical ligand exchange, 3 mL of oleate-capped CdTe NC solution in hexane (~30 mg/mL) was mixed with 3 mL of $CdCl_3^-$ solution in NMF (0.1 M). Under vigorous stirring, NCs gradually transferred from hexane to NMF. Typically, it took up to several hours until a complete phase transfer, resulting in a colorless hexane phase. The time required for ligand exchange was strongly dependent on the concentration of NCs, and also affected by the cations of chlorocadmates. A much shorter time (within 15 minutes) is required for CdTe NCs with a lower concentration (5 mg/mL). The bottom phase containing CdTe NCs was then rinsed with fresh hexane three times. In detail, 3 mL of fresh hexane was mixed with the solution of $CdCl_3^-$-capped CdTe NCs in NMF, forming a two-phase mixture. This mixture was vigorously stirred for about 20 minutes. During this process, residual organic ligands and related species soluble in the non-polar hexane phase were removed from the NC solution in NMF. The hexane layer was then discarded and replaced with fresh hexane. After a triple wash with hexane, a mixture of toluene (1 mL) and HMPA (0.5 mL) was added, leading to the flocculation of NC solution. The NC precipitates were collected by centrifugation, and re-dispersed in 1 mL of propylene carbonate or pyridine. The ligand exchange procedure can be scaled up to produce >1 g of $CdCl_3^-$-capped CdTe NCs in a single batch. The solution of $CdCl_3^-$-capped CdTe NCs in pyridine was vigorously stirred for ~1 hour in air, followed by centrifugation to remove the insoluble part. The concentration of the colloidally stable solution (the "$CdCl_3^-$-capped CdTe NC ink") can be as high as 150 mg/mL. In pyridine, $CdCl_3^-$-capped NCs with $C_5H_5NH^+$ cations showed a slightly higher solubility than those with $NH_4^+$, presumably due to the compatibility of the cation and the solvent.

4. Characterization Techniques

Transmission electron microscopy (TEM) images of NCs were obtained using a 300 kV FEI Tecnai F30 microscope. The optical absorption spectra of NC solutions were collected using a Cary 5000 UV-Vis-NIR spectrophotometer in the transmission mode. To investigate the evolution of size and excitonic features of $CdCl_3^-$-capped CdSe NCs, thin films were prepared by drop-casting NC solution in NMF on quartz substrates, followed by drying under vacuum to remove the solvent. The dried $CdCl_3^-$-capped CdSe NC thin films were annealed at various temperatures on a hot-plate in a $N_2$-filled glove box. The absorption spectra of thin films were measured in the transmission mode. Fourier-transform infrared (FTIR) spectra were acquired in the transmission mode using a Nicolet Nexus-670 FTIR spectrometer. Samples for FTIR measurements were prepared by drop casting concentrated NC dispersions on KBr crystal substrates (International Crystal Laboratories) and were then dried under vacuum to remove solvent molecules. Additional annealing at 200° C. under vacuum was applied to the $CdCl_3^-$-capped NC samples to completely remove any residual solvents. IR absorbance was normalized to the weight of absorbing material deposited per unit area of the substrate. To quantitatively compare IR spectra, standard background subtraction and baseline correction routines were applied. Scanning electron microscopy (SEM) images of sintered CdTe thin films and the complete CdTe solar cell devices were acquired on FEI NanoSEM Nova 200 (top-view), FEI NanoSEM Nova 630 and Zeiss-Merlin (cross-sectional), respectively. For top-view SEM, single-layer CdTe thin films were deposited on silicon substrate from the new $CdCl_3^-$-capped CdTe NC ink (annealed at 350° C. for 20 s). The same CdTe thin films were used for wide angle powder X-ray diffraction (XRD) and X-ray photoelectron spectroscopy (XPS) measurements. The XRD patterns of CdTe thin films made from organically capped CdTe NCs and the new ink were collected using a Bruker D8 diffractometer with a Cu $K_\alpha$ X-ray source operating at 40 kV and 40 mA. In-situ XRD measurements were carried out by ramping the temperature from 25 to 600° C. (3° C./min) with frames taken every 195 sec. The thin film samples were enclosed in an O-ring sealed dome with a plastic cap and a temperature-controllable metallic bottom. The dome was evacuated and re-filled with $N_2$ several cycles to remove residual air or moisture prior to the measurement. Afterward, the dome was kept under vacuum during the in-situ measurement. The samples were annealed by the temperature-controllable bottom part of the dome during the measurement. The source and detector of the diffractometer were set to 190 with respect to horizontal. A 2D intensity color map was made by compiling the frames using a homemade Matlab software. XPS analysis on sintered CdTe thin films made from "standard," "additive" (see details below), and the new $CdCl_3^-$-capped CdTe NC ink was performed on a Kratos AXIS Nova spectrometer using a monochromatic Al $K_\alpha$ source (hv=1486.6 eV). The Al anode was powered at 10 kV and 15 mA. Instrument base pressure was $1 \times 10^{-9}$ Torr. High-resolution spectra in Cd 3d, Te 3d, C 1s, and Cl 2p regions were collected using an analysis area of 0.3×0.7 $mm^2$ and 20 eV pass energy. All spectra were background subtracted using XPS subtraction software in Origin. Te and Cd spectra were subtracted using a Tougaard algorithm while C and Cl used a Shirley algorithm. The XPS intensities for all elements were normalized to the area under the Cd 3d curves for proper comparison. Zeta-potential (ζ-potential) data were collected using a Zetasizer Nano-ZS (Malvern Instruments, UK).

5. CdTe Solar Cell Fabrication a) The "Standard" Approach

In the "standard" approach, the CdTe absorber layer was spin-coated from pyridine-exchanged CdTe NC ink through a layer-by-layer deposition approach, together with inter-layer chemical ($CdCl_2$) and thermal treatment (350° C., 20 s). In detail, 25 mm×25 mm indium tin oxide (ITO)-coated glass substrates (Thin Film Devices Inc) were cleaned by sequential sonication in deionized water (DI) and Alconox detergent, DI, acetone, IPA, and DI. Afterward, the substrates were dried under $N_2$, and hydrophilized for 10 minutes using a Harrick PDC-001 Extended Plasma Cleaner. The pyridine-exchanged CdTe NC solution was precipitated by hexane and dissolved in a 1:1 mixture of pyridine and 1-PA at the desired concentration. The solution was sonicated for 10 minutes and filtered through a 0.2 μm PTFE syringe filter. The filtered CdTe NC solution was spin-coated onto an ITO substrate at 800 rpm for 30 seconds followed by 2000 rpm for 10 s, dried at 150° C. for 2 min, and cooled in air. For the $CdCl_2$ treatment, the spin-coated CdTe layer was dipped in a saturated $CdCl_2$ bath in methanol for 15 seconds, thoroughly rinsed with IPA and dried under $N_2$ flow. The substrate was annealed at 350° C. for 20 seconds and cooled in air. The whole process (spin-coating, $CdCl_2$ treatment, thermal treatment) was repeated multiple times (12-20) until the desired thickness was achieved. Using this approach, devices with ~400 or ~550 nm-thick CdTe active layers were fabricated by spin-coating different layers of CdTe NC ink.

The ZnO layer was deposited on top of CdTe by spin-coating 300 μL of ZnO sol-gel at 3000 rpm for 30 s, followed by annealing at 300° C. for 2 minutes. The ZnO sol-gel was prepared by sonicating a mixture of 1.50 g of zinc acetate dihydrate, 15 mL of 2-methoxyethanol, 420 μL of ethanolamine, and 15-45 mg of $InCl_3$ for 1 hour, and subsequently stirred overnight.

After deposition of the ZnO layer, the substrates were transferred into a glove box and kept under high vacuum overnight. Top Al contacts (100 nm) were deposited by thermal evaporation through a homemade mask featuring evenly distributed 8 $mm^2$ holes. Ag (100 nm) was deposited on top of Al to increase device longevity. Three sides of the device stack were scratched off to expose the ITO. Electrical contact was established using colloidal Ag paint (Ted Pella Inc).

For XPS studies on thin films made from the "standard" approach, a single layer of CdTe was deposited on ITO or silicon substrate, followed by $CdCl_2$ treatment and annealing.

b) The "Additive" Approach

Figure 4:
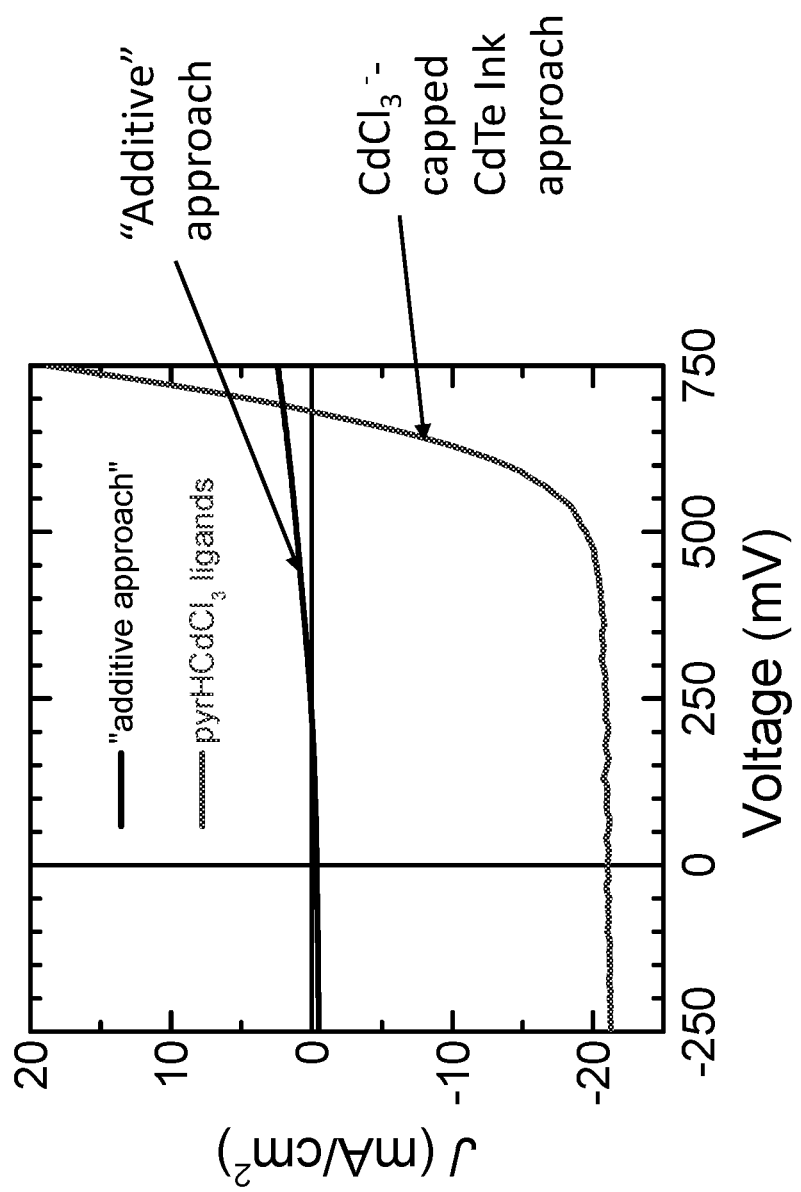
FIG. 4 shows the JV curves for CdTe solar cells made with the "additive" approach and with the $CdCl_3^-$-capped CdTe NC ink (layer thickness<400 nm) approach, measured under AM 1.5G illumination.

In the "additive" approach, about 5 wt. % of $CdCl_2$ (with respect to the amount of CdTe NCs) was added to the pyridine-exchanged CdTe NC ink. The mixture was used as the soluble precursor for CdTe layers. Solar cell device fabrication was performed in a similar manner with the "standard" approach without the interlayer CdCl$_2$ treatment. The solar cell device made from the "additive" approach showed poor performance, as shown in FIG. 4. For the XPS study, a single layer of CdTe was deposited on ITO from the mixture of CdCl$_2$ and pyridine-exchanged CdTe NC ink, followed by annealing at 350° C. for 20 seconds.

c) The New CdCl$_3^-$-capped CdTe NCs Ink Approach

A similar, but CdCl$_2$ treatment-free approach was adopted in the fabrication of CdTe adsorber layer from the designed CdCl$_3^-$-capped CdTe NCs ink. In brief, the CdCl$_3^-$-capped CdTe NC solution in pyridine was diluted with 1-propanol in a 1:1 volume ratio, forming an ink of about 40 mg/mL. Layers of CdTe were spin-coated on an ITO substrate with interlayer thermal treatment (350° C., 20 s) for CdTe grain growth. For XRD, top-view SEM, and XPS studies on CdTe thin films from the new ink, a single layer of CdTe was deposited on ITO or silicon substrate, followed by annealing.

6. CdTe Solar Cell Device Characterization

Devices were tested under the illumination of an Xe lamp with a AM 1.5G filter (Newport 67005) and calibrated with a Si photodiode with a KG5 filter (Hamamatsu Inc, S1787-04). The illumination area was controlled by a self-aligning stainless steel aperture mask with evenly distributed, nominally 6 mm$^2$ circular holes (5.94 mm$^2$ measured). JV characteristics were acquired using a Keithley 2400 source meter controlled by a Labview interface. To mitigate heating during measurements, the perimeter of the cell was in direct contact to an Al heat sink. The instruments were controlled and data collected using a homemade Labview program. Current/Light soaking was done by applying 2-3 V (forward bias) to the device under illumination for 5 minutes (7 minutes for devices made from the "standard" approach with a ~550 nm-thick CdTe layer). Typically, this generated a current density of ~2.5 A cm$^{-2}$. The current was monitored carefully to not exceed a 3 A cm$^{-2}$, as current densities greater than this generally caused performance degradation. Holding the devices in reverse bias generally caused a transient decrease in performance (due to reduced V$_{OC}$). External quantum efficiency (EQE) and internal quantum efficiency (IQE) measurements were taken using Oriel IQE-200 with a step of 10 nm for the wavelength. Capacitance-voltage (Mott-Schottky) data were acquired using a Gamry Reference 600 potentiostat. Data were acquired using a frequency of 500 Hz with an amplitude and step size of 5 and 10 mV, respectively. To compare performance of devices made from the "standard" approach and the new CdCl$_3^-$-capped CdTe NC ink, the same batch of oleate-capped CdTe NCs were used. Pyridine-exchange and ligand exchange with CdCl$_3^-$ were carried out on NC for the "standard" and the new ink, respectively. Solar cells with ~400 and ~600 nm CdTe active layers were fabricated by using both approaches, with all other procedures (e.g., treatment of ITO substrates, the deposition of ZnO and Al/Ag layers) remaining identical.

7. Field-effect-transistor (FET) Device Fabrication and Electrical Measurements

Prime grade, n-type arsenic doped Si wafers with 100 nm-thick SiO$_2$ gate dielectrics (<0.005 Ωcm, NamKang High-Tech) were used as gate substrates. The substrates were cleaned by piranha treatment followed by multiple rinses with DI water before use. Solutions of CdCl$_3^-$-capped CdSe NCs (~70 mg/ml in NMF) were spin-coated on the cleaned substrates at 600 rpm for 6 seconds, followed by 2000 rpm for 60 seconds. A 500 W infrared lamp was used to maintain the temperature of solutions and substrates at ~70° C. The resulting 30-40 nm-thick NC films were annealed at 100° C. for 1 hour to evaporate residual solvents, and then annealed at 200, 250, 300, or 350° C. for 30 minutes. 100-nm-thick Al source/drain electrodes were thermally evaporated through a shadow mask to complete a top-contact, bottom-gate FET structure (channel width W: 1500 μm and channel length L=125 μm). All fabrication steps except substrate cleaning were performed in a N$_2$-filled glove box. The ligand exchange of CdSe NCs with NH$_4$CdCl$_3$ and deposition of the FET channel in air was also attempted. In this case, the spin-coating of CdCl$_3^-$-capped CdSe NCs on gate substrates was performed in air, followed by the thermal annealing at 300° C. for 30 minutes. The source/drain electrodes were evaporated in a N$_2$-filled glove box.

FET devices were measured using a semiconductor analyzer (Agilent B 1500A) in a N$_2$-filled glovebox. The linear regime FET mobility was calculated by fitting the experimental data to the following equation: $\mu=(L/WC_iV_{DS})(dI_{DS}/dV_G)$ for the linear regime, where $C_i$, $V_{DS}$, $I_D$, and $V_G$ are the capacitance per unit area, drain-source voltage, drain current, and gate voltage, respectively.

For proper comparison of concentrations of elements in single-layer CdTe thin films made from different approaches, the XPS intensities for Te 3d, C 1s, and Cl 2p were normalized by the area under the Cd 3d curves. The normalized Cd 3d curves for thin films made from the "standard" approach and new CdCl$_3^-$-capped CdTe NC ink were similar, while those for the sample made from "additive" approach showed shoulder peaks at higher binding energies. These components should be attributed to residual CdCl$_2$ since a large amount of CdCl$_2$ (5 wt % with respect to CdTe) was introduced to the pyridine-exchange CdTe NCs for the "additive" approach. As expected, similar intensities were observed in Te 3d spectra for different samples. Thin film made from the new ink showed two peaks at higher binding energies (~585 and ~576 eV for Te 3d$_{3/2}$ and 3d$_{5/2}$, respectively), probably due to the formation of tellurium oxides at the surface. Importantly, thin films made from the "standard" approach and the new ink showed much reduced C 1s intensities compared to the "additive" sample. This reduction in carbon content, or the amount of residual organic ligands, is critical to achieving efficient charge separation and transport, which govern the overall power conversion efficiency (PCE). As a consequence, solar cells made from the "additive" approach, with a significantly higher amount of residual organic ligands, suffered from poor device performance. XPS confirmed the existence of Cl in all samples. According to previous research, the CdTe sintering/recrystallization occurs with the formation of Te—Cl compounds (TeCl$_2$ or TeCl$_4$) in a liquid or gas phase, which enhance the mobility of nearby Cd and Te atoms, resulting in well-sintered CdTe grains.[4] In the new ink, the surface CdCl$_3^-$ ligands provide adequate Cl$^-$ for CdTe NC sintering.

Example 3

This example describes a method for combining roll-to-roll friendly techniques into a single, integrated process for solar cell fabrication. CdCl$_3^-$-capped CdTe NCs were easily deposited via spray-coating or doctor-blading by adjusting the procedure outlined in Example 2 to improve solubility and increase film thickness for a single layer. Infrared (IR) lamps, rather than a hot plate, were used to anneal the substrates during layer-by-layer deposition. All of these advances in CdTe absorber layer deposition seamlessly integrate into a single, roll-to-roll friendly process that can be adapted to different substrate geometries and materials.

Experimental Procedure

1. Chemicals

Cadmium oxide (CdO, 99.99+%), tellurium shot (Te, 99.999%), cadmium chloride (CdCl$_2$, 99.99%), pyridinium hydrochloride (pyr.HCl, 98%), zinc acetate dihydrate (Zn(OAc)$_2$.2H$_2$O, 99.999%), indium chloride (InCl$_3$, 99.999%), oleic acid (OA, technical grade, 90%), 1-octadecene (ODE, technical grade, 90%), tributylphosphine (TBP, 97% with isomers), toluene (≥99.8%, anhydrous), ethanol (≥99.5%, anhydrous), pyridine (99.8%, anhydrous), hexane (95%, anhydrous), N-methylformamide (NMF, 99%), hexamethylphosphoramide (HMPA, 99%), 1-propanol (1-PA, 99.7%, anhydrous), 2-methoxyethanol (99.9%, anhydrous), and ethanolamine (99.5%, redistilled) were purchased from Aldrich. Molecular sieves grade 564 (Type 3A, 8-12 mesh beads), acetone (certified ACS), methanol (certified ACS), and 2-propanol (IPA, certified ACS) were purchased from Thermo Fisher Scientific. Aluminum (Al, 99.99%) and silver (Ag, 99.99%) pellets were purchased from Kurt J. Lesker Company. PELCO colloidal silver paste (Ag paste) was purchased from Ted Pella, Inc. 10 wt. % TBP:Te was prepared by dissolving 10 g of Te shot in 90 g of TBP overnight in a N$_2$-filled glove box. ODE was recrystallized by cooling the bottle in a chiller overnight at 12° C. and decanted to remove impurities. OA was cooled to 16° C. overnight and vacuum filtered to remove high melting point impurities. Pyridine, NMF, and 1-PA were distilled to remove low and high boiling point impurities. NMF and HMPA were dried over molecular sieves and filtered with 0.2 μm PTFE filter before use.

2. CdTe NC Ink Preparation.

a) Oleate-capped CdTe NC Synthesis

CdTe NCs capped with oleate were synthesized with a modified method described by MacDonald et al. (Jasieniak, J.; MacDonald, B. I.; Watkins, S. E.; Mulvaney, P. *Nano Lett.* 2011, 11, 2856; MacDonald, B. I.; Gaspera, E. D.; Watkins, S. E.; Mulvaney, P.; Jasieniak, J. J. *J. Appl. Phys.* 2014, 115, 184501.) In short, 4.80 g CdO, 42.4 g recrystallized OA, and 40.0 g recrystallized ODE were charged in a 500 mL flask and evacuated overnight to remove trace oxygen. The flask was heated to 80° C. until the pressure equilibrated. Under dry nitrogen, the mixture was heated to 220° C. until the solution turned clear, indicating a completed reaction. The flask was cooled to <90° C. and evacuated. The flask was heated to 110° C. once the solution stopped bubbling and left until the pressure equilibrated. Under dry nitrogen, the flask was heated to 270° C. and 24 mL of 10 wt. % TBP:Te was injected. The heating mantle was removed immediately and the flask was allowed to air cool to <50° C. The resulting CdTe NC solution was split evenly and purified using anhydrous toluene and ethanol as the solvent/non-solvent combination.

b) Pyridine Ligand Exchange and Pyridine-capped CdTe NC Ink

Following 4-6 purification cycles, CdTe NCs were redispersed in anhydrous pyridine at a concentration of ~80 mg/mL. The solution was stirred under N$_2$ overnight on a hotplate set to 100° C., followed by precipitation using hexane. The CdTe NC precipitates were re-dispersed in fresh pyridine to prepare the pyridine-capped CdTe NC stock solution. The stock pyridine-capped CdTe NC solution was precipitated by hexane and dissolved in a 1:1 mixture of pyridine and 1-PA to the desired concentration. The solution was sonicated for 10 minutes and filtered through a 0.2 μm PTFE syringe filter to prepare the spin-coating solution.

c) CdCl$_3^-$ Ligand Exchange

The procedure was adapted from the process described previously in Example 2. In short, chlorocadmates (CdCl$_3^-$) with pyridinium (pyr-H$^+$) cations were synthesized by mixing equimolar amount of CdCl$_2$ and pyr.HCl in NMF (0.1 M). In a typical ligand exchange, 18 mL of the oleate-capped CdTe NC solution in hexane (~30 mg/mL) was mixed with 18 mL of CdCl$_3^-$ solution in NMF (0.1 M). Under vigorous stirring, NCs gradually transferred from hexane to NMF. Upon phase transfer, the bottom phase containing CdTe NCs was then rinsed with fresh hexane three times.

i. "Original" CdCl$_3^-$-capped CdTe NC Ink.

Following the CdCl$_3^-$ ligand exchange (Section 2c), a mixture of toluene (6 mL) and HMPA (3 mL) was added, leading to the flocculation of NCs in solution. The NC precipitates were collected by centrifugation, and re-dispersed in 5 mL of pyridine. The solution of CdCl$_3^-$-capped CdTe NCs in pyridine was vigorously stirred for ~2 hours in air, followed by centrifugation to remove the insoluble part. An equal amount of 1-PA was added to the NC solution in pyridine to make the "original" ink.

ii. "Overwashed" CdCl$_3^-$-capped CdTe NC Ink

Following CdCl$_3^-$ ligand exchange (Section 2c), the NCs were precipitated with the same non-solvent mixture outlined previously (Section 2c.i). However, instead of re-dispersing in pyridine, the NCs were dissolved in NMF (~18 mL). The same precipitation and re-dispersing procedure was repeated. Following a third precipitation, the NCs were re-dispersed in 2.5 mL pyridine and stirred vigorously for ~2 hrs. The solution was centrifuged to remove insoluble NCs and a concentration was calculated. Additional pyr-HCdCl$_3$ ligand solution in pyridine was added to the NC solution in varying amounts to replenish Cl necessary for grain growth. An equal amount of 1-PA was added to the solution to make the "overwashed" ink.

3. CdTe Absorber Layer Deposition and Treatments a) Substrate Preparation

In detail, 25 mm×25 mm indium tin oxide (ITO)-coated glass substrates (Thin Film Devices Inc.) were cleaned by sequential sonication in deionized water (DI) and Alconox detergent, DI, acetone, IPA, and DI. Afterward, the substrates were dried under N$_2$, and hydrophilized for 10 minutes using a Harrick PDC-001 Extended Plasma Cleaner.

b) Deposition of CdTe NC Ink.

i. Spin-coating

The CdTe NC inks outlined previously (Section 2b, c.i, & c.ii) were spin-coated using the following procedure. Using the freshly plasma treated ITO substrates, the CdTe NC ink was pipetted (~250 μL) onto the substrate and spun at 800 rpm for 30 seconds followed by 2000 rpm for 10 seconds. The substrate was transferred to a hot plate and dried at 150° C. for 2 minutes.

ii. Spray-coating

The CdTe NC ink outlined previously (Section 2b, c.i, & c.ii) was diluted with methanol by 6 parts methanol to 1 part NC solution. The layer thickness was controlled by changing the NC concentration in 1:1 pyridine: 1-PA. A homemade spray-coating system was built by using a hot plate and a Paasche airbrush set to 45° to create a thinner wetting layer. The ink was loaded into the airbrush and sprayed briefly to wet the surface. The spray was controlled by solenoid valves attached to a power supply. The substrate was heated to 38° C. to facilitate drying. The spray-coating system was upgraded by making a metal turntable heated to 38° C. to move the substrates through the spray and process multiple substrates at a time. The spray nozzle was upgraded to a VMAU-316SS spraying assembly from Spraying Systems Co. to more easily adjust spray parameters. Upon deposition, the substrate was dried at 150° C. for 2 minutes.

iii. Doctor-blading

The same ink preparation procedure outlined for spray-coating (Section 3b.ii) was used. An Al block was heated on a hot plate to 40° C. to facilitate smooth deposition. Glass slides were placed onto the block to act as height guides. A small amount of the NC solution (~75 μL) was pipetted onto the substrate and a glass rod was used to smooth the film by moving back and forth. The excess was wicked away by sweeping the rod onto the glass slides. Upon deposition, the substrate was dried at 150° C. for 2 minutes.

c) Chemical and Thermal Treatment.

i. $CdCl_2$ Bath and Annealing for CdTe/Pyridine

For the $CdCl_2$ treatment, the substrate was cooled in air and was dipped into a saturated $CdCl_2$ bath in methanol at ~60° C. for 15 s, thoroughly rinsed with IPA and dried under $N_2$ flow. The substrate was annealed at 350° C. on a hot plate (or under an IR lamp shielded with Al foil) for 20 seconds and cooled in air. The whole process (deposition, drying, $CdCl_2$ treatment, thermal treatment) was repeated multiple times (12-20) until the desired thickness was achieved.

ii. Annealing Only

For $CdCl_3^-$-capped CdTe NC inks, there was no need for a $CdCl_2$ bath treatment. Instead, the substrate was transferred directly from the drying plate to the annealing plate. The substrate was annealed at 350° C. on a hot plate (or under an IR lamp shielded with Al foil) for 20 seconds and cooled in air. The whole process (deposition, drying, annealing) was repeated multiple times (12-20) until the desired thickness was achieved.

d) Spray-coating onto Curved Substrates

Glass rods, beads, and plano-convex lenses were purchased from various outside vendors. They were affixed to the spray-coater using double sided tape. For full devices, special holders would be advantageous to assure consistency as well as reduce mistakes from processing difficulties.

4. Finishing CdTe Solar Cell a) ZnO n-type Layer

The ZnO layer was deposited on top of CdTe by spin-coating 300 μL of ZnO sol-gel at 3000 rpm for 30 seconds, followed by annealing at 300° C. for 2 minutes. The ZnO sol-gel was prepared by sonicating a mixture of 1.50 g of $Zn(OAc)_2$ $2H_2O$, 15 mL of 2-methoxyethanol, 420 μL of ethanolamine, and 15-45 mg of $InCl_3$ for 1 h, and subsequently stirred overnight.

b) Electrode Deposition

The substrates were transferred into a glove box and kept under high vacuum (~$10^{-9}$ Torr) overnight. Top Al contacts (100 nm) were deposited by thermal evaporation through a homemade mask, featuring evenly distributed 8 $mm^2$ holes. Ag (100 nm) was deposited on top of Al to increase device longevity. Three sides of the device stack were scratched off to expose the ITO. Electrical contact was established using Ag paint.

5. Characterization Techniques

The optical absorption spectra of NC solutions were collected using a Cary 5000 UV-Vis-NIR spectrophotometer in the transmission mode. Scanning electron microscopy (SEM) images of the complete CdTe solar cell devices were acquired on Zeiss-Merlin. X-ray photoelectron spectroscopy (XPS) analysis was performed on a Kratos AXIS Nova spectrometer using a monochromatic Al $K_\alpha$ source (hv=1486.6 eV). The Al anode was powered at 10 kV and 15 mA. Instrument base pressure was $1\times10^{-9}$ Torr. High-resolution spectra in Cd 3d, Te 3d, C is, Cl 2p and P 2p regions were collected using an analysis area of 0.3×0.7 $mm^2$ and 20 eV pass energy.

6. Photovoltaic Characterization

Devices were tested under the illumination of a Xe lamp with an AM 1.5G filter (Newport 67005) and calibrated with a Si photodiode with a KG5 filter (Hamamatsu Inc, S1787-04). The illumination area was controlled by a self-aligning stainless steel aperture mask with evenly distributed, nominally 6 $mm^2$ circular holes (5.94 $mm^2$ measured). Current density versus voltage (JV) curves were acquired using a Keithley 2400 source meter controlled by a Labview interface. To mitigate heating during measurements, the perimeter of the cell was in direct contact to an Al heat sink. The instruments were controlled and data collected using a homemade Labview program. Current/light soaking was done by applying 2-3 V (forward bias) to the device under illumination for varying amounts of time. Typically, this generated a current density of ~2.5 A $cm^{-2}$. The current was monitored carefully to not exceed a 3 A $cm^{-2}$, as current densities greater than this generally caused performance degradation. Holding the devices in reverse bias generally caused a transient decrease in performance (due to reduced $V_{OC}$). External quantum efficiency (EQE) measurements were taken using Oriel IQE-200 with a step of 20 nm for the wavelength. Capacitance-voltage (Mott-Schottky) data were acquired using a Gamry Reference 600 potentiostat. Data were acquired using a frequency of 500 Hz with an amplitude and step size of 5 and 10 mV, respectively.

Results and Discussion

A procedure that combines doctor-blading (or spray-coating), $CdCl_3^-$ chemistry, and IR lamps integrated into a roll-to-roll friendly process was developed. Transitioning to spray-coating or doctor-blading allows for a continuous process stream without the need to load the substrate onto a platform that grips it. $CdCl_3^-$ chemistry eliminates the need for the $CdCl_2$ treatment, a tedious process that is difficult to reproduce. Instead, the ink is self-contained, comprising the CdTe NCs and the $CdCl_2$ grain growth promoter. Changing from a hot plate to an IR lamp proves the substrate does not need to be heated from the glass side to create continuous grains of CdTe throughout the film. IR lamps allow the substrate to simply move through a heated zone instead of requiring a hot surface.

Figure 5:
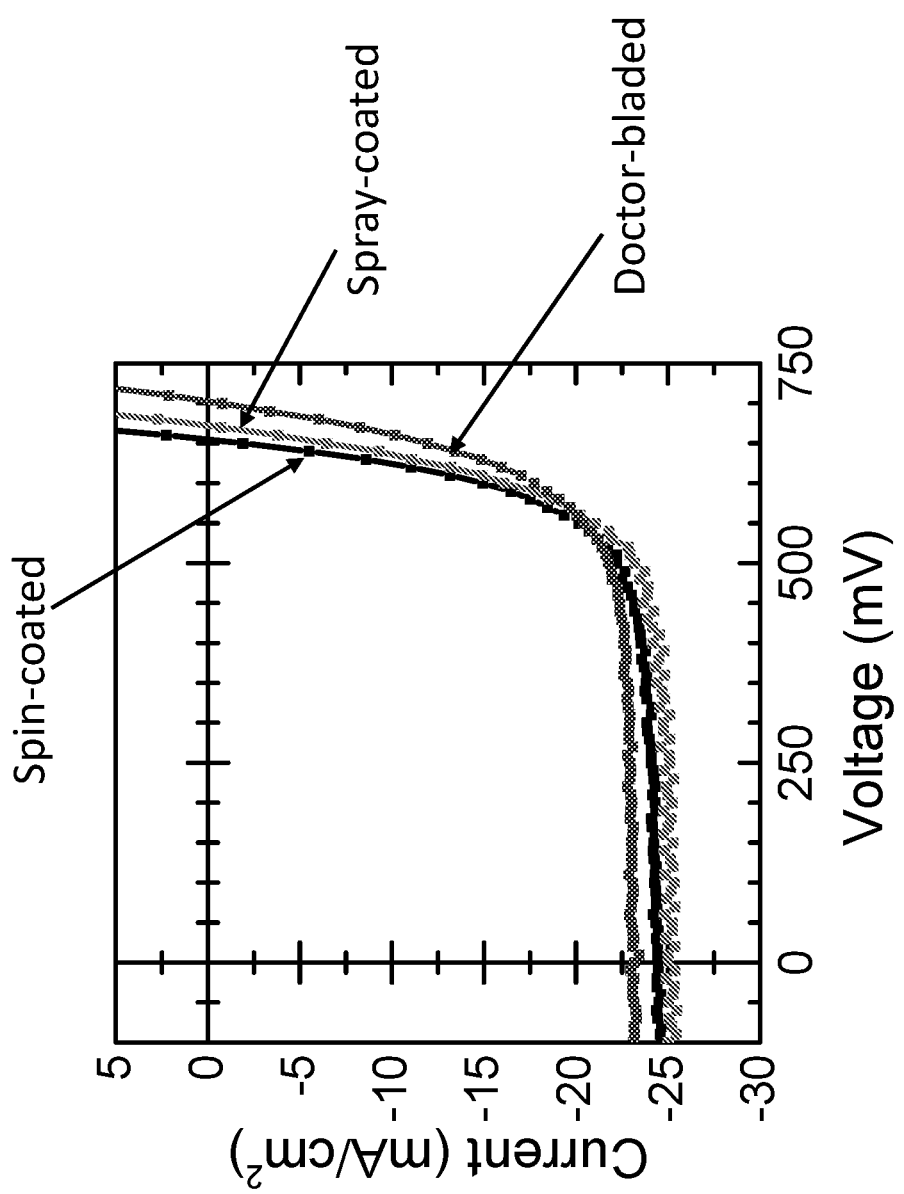
FIG. 5 shows the JV curves under AM 1.5G illumination for spin-coated, spray-coated, and doctor-bladed CdTe absorber layers.

Spin-coating is not conducive to roll-to-roll fabrication because it scales poorly to large areas, wastes considerable amounts of material, is not a high-throughput deposition method, and limits the geometry to planar substrates. All of these factors make other deposition methods, such as spray-coating or doctor-blading, better alternatives. The devices made via spray-coating and doctor-blading had roughly the same efficiencies as those made using spin-coating, as illustrated in the JV curves of FIG. 5.

The devices made using roll-to-roll friendly techniques were comparable to spin-coated devices. Both techniques proved effective at consistently improving $V_{oc}$, a device parameter that typically depends more on device architecture than processing conditions. This demonstrates that the CdTe absorber layer is denser with fewer defects that contribute to Shockley-Read-Hall recombination and increase shunting. $J_{sc}$ showed as much variability as is typical for the CdTe NC ink.

Spin-coating was a materials inefficient method for depositing the ink. 200 μL of 40 mg/mL NC ink was required to cover a single 25 mm×25 mm substrate. Over the course of 20 layers, ~500 nm of CdTe was deposited onto the substrate. This means about 160 mg of NC is required to deposit ~1.9 mg of CdTe, conservatively. The result was that only ~1% of the material remains on the substrate during spin-coating. For the same thickness device, 80 mg of CdTe NC is required during spray-coating and only 2 mg is required for doctor-blading. Unlike spin-coating, spray-coating can accommodate larger substrates without significant change to the film consistency. Larger areas also become more materials efficient. These techniques were both attempted without the benefit of process engineers optimizing it.

Example 4

This example describes the formation of $CdCl_3^-$-capped HgSe nanocrystals and $CdI_3^-$-capped HgTe nanocrystals.

HgSe Nanocrystal Synthesis. HgSe nanocrystals were synthesized according to the methods described in Z. Deng et al. *ACS Nano*, 2014, 8, 11707, scaled up by a factor of two. Briefly, 0.2 mmol $HgCl_2$ (54 mg) was added to 8 mL oleylamine and degassed at 110° C. for an hour. This solution was put under nitrogen and a solution of 0.2 mmol selenourea (25.2 mg) in 2 mL oleylamine was injected. The solution, which immediately turned black, was heated at 110° C. for 10 minutes. The reaction was stopped by the removal of the heat and the injection of 15 mL tetrachloroethylene (TCE). The HgSe nanocrystals were isolated by the addition of methanol non-solvent and centrifugation. The resulting nanocrystal solid was dissolved in 3 mL TCE.

$CdCl_3^-$ Capping of HgSe Nanocrystals. The nanocrystals were isolated from the TCE by the addition of ethanol non-solvent and centrifugation and then redispersed in hexane. For ligand exchange, 1 mL of the HgSe nanocrystal solution (~25 mg/mL) was layered atop 1 mL of 0.1 M $NH_4CdCl_3$ or (pyridinium)$CdCl_3$ in NMF and stirred for two hours. The nanocrystals transferred to the polar phase, and the non-polar phase was washed with 1.5 mL hexane four times. The nanocrystal suspension in NMF was washed with a solution of 200 µL toluene and 100 µL HMPA, isolated by centrifugation, and redispersed in 1 mL NMF.

HgTe Nanocrystal Synthesis. HgTe nanocrystals were synthesized according to the methods described in S. E. Keuleyan et al. *ACS Nano*, 2014, 8, 8676. Briefly, 0.2 mmol $HgCl_2$ (54 mg) was dissolved in 6 g octadecylamine at 120° C., and this solution was degassed at 120° C. for an hour. This solution was put under nitrogen and cooled to 100° C. 0.2 mL of a 1 M solution of Te in trioctylphosphine (TOP) was diluted in 10 mL oleylamine. This Te solution was quickly injected into the $HgCl_2$ solution; the temperature dropped to 80° C. and the solution turned black. The nanocrystal solution was heated at 80° C. for 5 minutes and then the heat was removed and 15 mL of a quench solution (TCE, 10 vol. % dodecanethiol, ~1 vol. % TOP) was injected to stop the nanocrystal growth. The nanocrystals were isolated by the addition of methanol non-solvent and centrifugation. The resulting nanocrystal solid was dissolved in 5 mL TCE.

$CdI_3^-$ Capping of HgTe Nanocrystals. The nanocrystals were isolated from TCE by the addition of ethanol non-solvent and centrifugation, and the resulting nanocrystal solid was redissolved in hexane. 2 mL of a solution of HgTe in hexane (~5 mg/mL) was layered atop 2 mL of 0.1 M $CH_3NH_3CdI_3$ and stirred for 4 days. The nanocrystals transferred to the NMF, and the non-polar phase was washed with 2 mL hexane 4 times. The nanocrystal suspension in NMF was washed with a solution of 400 µL toluene and 200 µL HMPA, isolated by centrifugation, and redispersed in 1 mL NMF.

Example 5

This example describes the formation of $HgCl_3^-$-capped CdTe nanocrystals.

CdTe Nanocrystal Synthesis. CdTe nanocrystals were synthesized as described above.

$HgCl_3^-$ Capping of CdTe Nanocrystals. A 0.1 M $HgCl_3^-$ ligand solution was created by dissolving 0.5 mmol $HgCl_2$ (136 mg) and 0.5 mmol $NH_4Cl$ (26.7 mg) in 5 mL of dimethyl sulfoxide (DMSO) at room temperature.

The chloromercurate-CdTe ligand exchange was performed in a nitrogen glove box. A solution of oleic-acid capped CdTe nanocrystals in toluene was washed with ethanol, and the nanocrystals were isolated by centrifugation. The nanocrystals were redispersed in hexane to create 2 mL of a 25 mg/mL solution. This nanocrystal solution was layered atop 2 mL of the 0.1 M $NH_4HgCl_3$ solution and stirred until phase transfer occurred (~2 hours). The hexane layer was removed, and the polar phase was washed with hexane 3 times. Then the nanocrystals were isolated by addition of 1 mL toluene and 0.5 mL HMPA to the polar phase and centrifugation. The nanocrystal solid was redissolved in 1 mL DMSO.

Figures 6A, 6B:
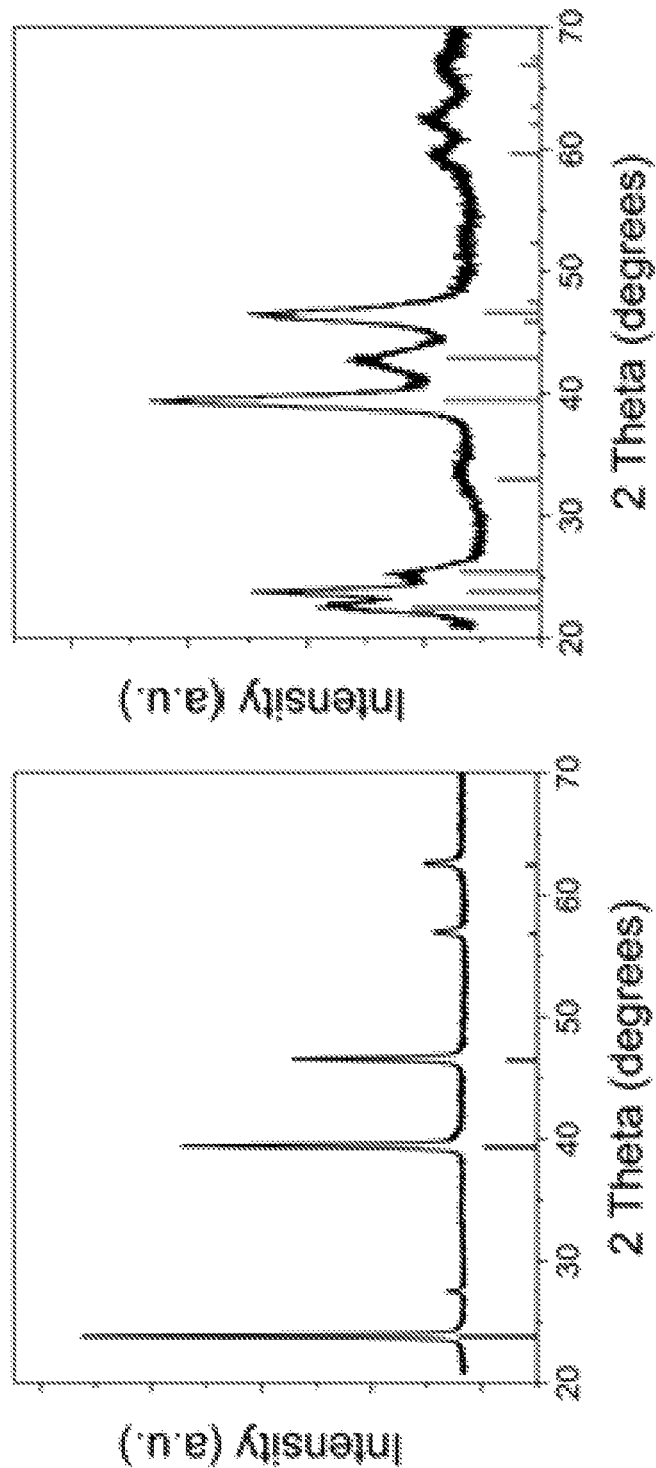
FIG. 6A shows the PXRD pattern for a CdTe film formed from $HgCl_3^-$-capped CdTe nanocrystals.
FIG. 6B shows the PXRD pattern for a CdTe film formed from oleic acid-capped CdTe nanocrystals.

The solutions were deposited onto glass substrates and annealed to form polycrystalline mercury cadmium telluride films. PXRD patterns were measured for films formed from sintered $HgCl_3^-$-capped CdTe nanocrystals (FIG. 6A) and from sintered oleic acid-capped CdTe nanocrystals (FIG. 6B). The PXRD patterns show that the $HgCl_3^-$-capped CdTe sintered much more significantly at 200° C. than did the oleic acid-capped CdTe even at 300° C. The mean grain size for the $HgCl_3^-$-capped CdTe film was approximately 28 nm and the grains were zinc blende phase. The mean grain size for the oleic acid-capped CdTe film was approximately 7 nm and the grains were wurtzite phase.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a semiconductor film, the method comprising:
    forming a solution of halometallate-capped semiconductor nanocrystals, the halometallate-capped semiconductor nanocrystals comprising:
    semiconductor nanocrystals, each semiconducting nanocrystal having a surface; and
    halometallate ligands bound to the surfaces of the semiconductor nanocrystals;

forming a coating of the solution comprising the halometallate-capped semiconductor nanocrystals on a substrate surface; and annealing the coating, wherein the nanocrystals are sintered to form the semiconductor film.

2. The method of claim 1, wherein the halometallate ligands act as grain growth promoters for the semiconductor nanocrystals during the annealing of the coating.

3. The method of claim 1, wherein the semiconductor nanocrystals are Group II-VI nanocrystals.

4. The method of claim 3, wherein the Group II-VI nanocrystals comprise a metastable phase of the Group II-VI semiconductor.

5. The method of claim 3, wherein the Group II-VI nanocrystals comprise CdTe nanocrystals, HgSe nanocrystals, HgTe nanocrystals, HgS nanocrystals, $Hg_xCd_{1-x}Te$ nanocrystals, $Hg_xCd_{1-x}S$ nanocrystals, $Hg_xCd_{1-x}Se$ nanocrystals, $Cd_xZn_{1-x}Te$ nanocrystals, $Cd_xZn_{1-x}Se$ nanocrystals, $Cd_xZn_{1-x}S$ nanocrystals, CdSe nanocrystals, CdS nanocrystals, ZnS nanocrystals, ZnSe nanocrystals, ZnTe nanocrystals, or mixtures of two or more thereof, where $0<x<1$.

6. The method of claim 3, wherein the Group II-VI nanocrystals are CdTe nanocrystals.

7. The method of claim 1, wherein the halometallate ligands comprise halometallates of metals selected from group 12 or group 13 of the periodic table of the elements.

8. The method of claim 1, wherein the halometallate ligands are selected from $CdCl_3^-$ anions, $CdCl_4^{2-}$ anions, $CdI_3^-$ anions, $CdBr_3^-$ anions, $CdBr_4^{2-}$ anions, $InCl_4^-$ anions, $HgCl_3^-$ anions, $ZnCl_3^-$ anions, $ZnCl_4^{2-}$ anions, and $ZnBr_4^{2-}$ anions, and mixtures of two or more thereof.

9. The method of claim 6, wherein the halometallate ligands comprise $CdCl_3^-$ anions.

10. The method of claim 1, wherein the semiconductor nanocrystals comprise core-shell nanocrystals; the shells of the core-shell nanocrystals comprise a Group II-VI semiconductor; and the semiconductor film comprises the cores of the nanocrystals dispersed in a matrix comprising the sintered shells of the nanocrystals.

11. The method of claim 10, wherein the cores of the core-shell nanocrystals comprise a Group III-V semiconductor.

12. The method of claim 10, wherein the Group II-VI semiconductor is CdTe, HgSe, HgTe, HgS, $Hg_xCd_{1-x}Te$, $Hg_xCd_{1-x}S$, $Hg_xCd_{1-x}Se$, $Cd_xZn_{1-x}Te$, $Cd_xZn_{1-x}Se$, $Cd_xZn_{1-x}S$ nanocrystals, CdSe, CdS, ZnS, ZnSe, ZnTe, or mixtures of two or more thereof, where $0<x<1$.

13. The method of claim 1, wherein coating a solution comprising the halometallate-capped semiconductor nanocrystals on a substrate surface comprises doctor blading or spray-coating the solution comprising the halometallate-capped semiconductor nanocrystals onto the substrate surface.

14. The method of claim 5, wherein the Group II-VI nanocrystals comprise CdTe nanocrystals, HgSe nanocrystals, HgTe nanocrystals, HgS nanocrystals, $Hg_xCd_{1-x}Te$ nanocrystals, $Hg_xCd_{1-x}S$ nanocrystals, $Hg_xCd_{1-x}Se$ nanocrystals, $Cd_xZn_{1-x}Te$ nanocrystals, $Cd_xZn_{1-x}Se$ nanocrystals, $Cd_xZn_{1-x}S$ nanocrystals, ZnS nanocrystals, ZnSe nanocrystals, ZnTe nanocrystals, or mixtures of two or more thereof, where $0<x<1$.

15. The method of claim 8, wherein the halometallate ligands are selected from $CdCl_4^{2-}$ anions, $CdI_3^-$ anions, $CdBr_4^{2-}$ anions, $ZnCl_3^-$ anions, and $ZnBr_4^{2-}$ anions, and mixtures of two or more thereof.

16. The method of claim 8, wherein the halometallate ligands are $HgCl_3^-$ anions.

17. A method of forming an optoelectronic device, the method comprising:

forming a solution of halometallate-capped semiconductor nanocrystals, the halometallate-capped semiconductor nanocrystals comprising:

semiconductor nanocrystals, each semiconducting nanocrystal having a surface; and halometallate ligands bound to the surfaces of the semiconductor nanocrystals;

forming a coating of the solution comprising the halometallate-capped semiconductor nanocrystals on a surface of a first electrode;

annealing the coating, wherein the semiconductor nanocrystals are sintered to form a photoactive, light-absorbing semiconductor film;

forming a layer of charge transporting material over the photoactive, light-absorbing semiconductor film; and forming a second electrode on the layer of charge transporting material.

18. The method of claim 17, wherein the semiconductor nanocrystals comprise CdTe nanocrystals, HgSe nanocrystals, HgTe nanocrystals, HgS nanocrystals, $Hg_xCd_{1-x}Te$ nanocrystals, $Hg_xCd_{1-x}S$ nanocrystals, $Hg_xCd_{1-x}Se$ nanocrystals, $Cd_xZn_{1-x}Te$ nanocrystals, $Hg_xCd_{1-x}Se$ nanocrystals, $Hg_xCd_{1-x}S$ nanocrystals, CdSe nanocrystals, CdS nanocrystals, ZnS nanocrystals, ZnSe nanocrystals, ZnTe nanocrystals, or mixtures of two or more thereof, where $0<x<1$.

19. The method of claim 17, wherein the semiconductor nanocrystals are CdTe nanocrystals.

20. The method of claim 17, wherein the halometallate ligands are selected from $CdCl_4^{2-}$ anions, $CdI_3^-$ anions, $CdBr_4^{2-}$ anions, $ZnCl_3^-$ anions, and $ZnBr_4^{2-}$ anions, and mixtures of two or more thereof.

21. The method of claim 17, wherein the halometallate ligands are $HgCl_3^-$ anions.

22. The method of claim 18, wherein the Group II-VI nanocrystals comprise CdTe nanocrystals, HgSe nanocrystals, HgTe nanocrystals, HgS nanocrystals, $Hg_xCd_{1-x}Te$ nanocrystals, $Hg_xCd_{1-x}S$ nanocrystals, $Hg_xCd_{1-x}Se$ nanocrystals, $Cd_xZn_{1-x}Te$ nanocrystals, $Cd_xZn_{1-x}Se$ nanocrystals, $Cd_xZn_{1-x}S$ nanocrystals, ZnS nanocrystals, ZnSe nanocrystals, ZnTe nanocrystals, or mixtures of two or more thereof, where $0<x<1$.

23. The method of claim 19, wherein the halometallate ligands comprise $CdCl_3^-$ anions.

24. A method of forming a field effect transistor, the method comprising:

forming a solution of halometallate-capped semiconductor nanocrystals, the halometallate-capped semiconductor nanocrystals comprising:

semiconductor nanocrystals, each semiconducting nanocrystal having a surface; and halometallate ligands bound to the surfaces of the semiconductor nanocrystals;

forming a coating of the solution comprising the halometallate-capped semiconductor nanocrystals on a surface of a gate dielectric layer;

annealing the coating, wherein the semiconductor nanocrystals are sintered to form a semiconductor film that provides a conducting channel layer for the field effect transistor;

forming a source electrode on the semiconductor film;

forming a drain electrode on the semiconductor film; and forming a gate electrode on the gate dielectric layer.

25. The method of claim 24, wherein the semiconductor nanocrystals comprise CdTe nanocrystals, HgSe nanocrystals, HgTe nanocrystals, HgS nanocrystals, $Hg_xCd_{1-x}Te$ nanocrystals, $Hg_xCd_{1-x}S$ nanocrystals, $Hg_xCd_{1-x}Se$ nanocrystals, $Cd_xZn_{1-x}Te$ nanocrystals, $Cd_xZn_{1-x}Se$ nanocrystals, $Cd_xZn_{1-x}S$ nanocrystals, CdSe nanocrystals, CdS nanocrystals, ZnS nanocrystals, ZnSe nanocrystals, ZnTe nanocrystals, or mixtures of two or more thereof, where $0<x<1$.

26. Halometallate-capped Group II-VI nanocrystals comprising:

Group II-VI nanocrystals selected from the group consisting of CdTe nanocrystals, HgSe nanocrystals, HgTe nanocrystals, HgS nanocrystals, $Hg_xCd_{1-x}Te$ nanocrystals, $Hg_xCd_{1-x}S$ nanocrystals, $Hg_xCd_{1-x}Se$ nanocrystals, $Cd_xZn_{1-x}Te$ nanocrystals, $Cd_xZn_{1-x}Se$ nanocrystals, $Cd_xZn_{1-x}S$ nanocrystals, ZnS nanocrystals, ZnSe nanocrystals, ZnTe nanocrystals, or mixtures of two or more thereof, where $0<x<1$, each nanocrystals having a surface; and halometallate ligands bound to the surfaces of the Group II-VI nanocrystals, wherein the halometallate ligands are anions having one of the formulas $MX_3^-$, $MX_4^-$, and $MX_4^{2-}$, where M is an element selected from group 12 of the periodic table and X is a halide atom.

27. The nanocrystals of claim 26, wherein the Group II-VI nanocrystals are CdTe nanocrystals.

28. A method of making the halometallate-capped Group II-VI nanocrystals of claim 26, the method comprising forming a solution comprising organic ligand-capped Group II-VI nanocrystals and the anions under conditions that facilitate the exchange of the anions with the organic ligands capping the Group II-VI nanocrystals, whereby the halometallate-capped Group II-VI nanocrystals of claim 19 are formed.

* * * * *